(12) United States Patent
Shiono et al.

(10) Patent No.: US 7,405,142 B2
(45) Date of Patent: Jul. 29, 2008

(54) SEMICONDUCTOR SUBSTRATE AND FIELD-EFFECT TRANSISTOR, AND MANUFACTURING METHOD FOR SAME

(75) Inventors: Ichiro Shiono, Tokyo (JP); Masaharu Ninomiya, Tokyo (JP); Hazumu Kougami, Tokyo (JP)

(73) Assignee: Sumco Corporation, Tokyo (JP)

( * ) Notice: Subject to any disclaimer, the term of this patent is extended or adjusted under 35 U.S.C. 154(b) by 131 days.

(21) Appl. No.: 10/544,310

(22) PCT Filed: Feb. 6, 2003

(86) PCT No.: PCT/JP03/01242

§ 371 (c)(1),
(2), (4) Date: Mar. 2, 2006

(87) PCT Pub. No.: WO2004/070800

PCT Pub. Date: Aug. 19, 2004

(65) Prior Publication Data

US 2006/0258126 A1    Nov. 16, 2006

(30) Foreign Application Priority Data

Feb. 4, 2003   (JP) ............................. 2003-027596

(51) Int. Cl.
*H01L 21/44* (2006.01)

(52) U.S. Cl. ...................................... 438/607

(58) Field of Classification Search ............. 257/15–19, 257/190–194, E29.104, E29.193, E33.009, 257/E33.035; 438/166, 363, 487, 607
See application file for complete search history.

(56) References Cited

U.S. PATENT DOCUMENTS 5,221,413 A * 6/1993 Brasen et al. .................. 117/89

(Continued)

FOREIGN PATENT DOCUMENTS

CN        1336684 A      2/2002

(Continued)

OTHER PUBLICATIONS

R. People et al., "Calculation of critical layer thickness versus lattice mismatch for $Ge_xSi_{1-x}$/Si strained-layer heterostructures", Applied Physics Letters, vol. 47, No. 3, Aug. 1, 1985, pp. 322-324.
J. P. Dismukes, et al., "Lattice Parameter and Density in Germanium-SIlicon Alloys", The Journal of Physical Chemistry, vol. 68, No. 10, Oct. 1964, pp. 3021-3027.

*Primary Examiner*—Calvin Lee
(74) *Attorney, Agent, or Firm*—Pillsbury Winthrop Shaw Pittman, LLP

(57) ABSTRACT

A semiconductor substrate manufacturing method has a first layer formation process, a second layer formation process, a heat treatment process, and a polishing process; in the first layer formation process, the thickness of the first SiGe layer is set to less than twice the critical thickness, which is the film thickness at which dislocations appear and lattice relaxation occurs due to increasing film thickness; in the second layer formation process, the Ge composition ratio of the second SiGe layer is at least at the contact face with the first SiGe layer or with the Si layer, set lower than the maximum value of the Ge composition ratio in the first SiGe layer, and moreover, a gradient composition region in at least a portion of which the Ge composition ratio increases gradually toward the surface is formed. By this means, the penetrating dislocation density is kept low, surface roughness is low, and worsening of roughness at the surface and at interfaces due to heat treatment in device manufacturing processes or similar is prevented.

39 Claims, 12 Drawing Sheets

U.S. PATENT DOCUMENTS

| | | |
|---|---|---|
| 5,352,912 A | 10/1994 | Crabbe et al. |
| 5,442,205 A | 8/1995 | Brasen et al. |
| 5,500,389 A | 3/1996 | Lee et al. |
| 6,107,653 A | 8/2000 | Fitzgerald |
| 6,525,338 B2 * | 2/2003 | Mizushima et al. ............ 257/19 |
| 2002/0017642 A1 | 2/2002 | Mizushima et al. |
| 2002/0084000 A1 | 7/2002 | Fitzgerald |

FOREIGN PATENT DOCUMENTS

| | | |
|---|---|---|
| DE | 101 37 369 A1 | 4/2002 |
| EP | 0 541 971 A2 | 5/1993 |
| JP | 06-177046 | 6/1994 |
| JP | 06-252046 | 9/1994 |
| JP | 07-193078 | 7/1995 |
| JP | 07-201734 | 8/1995 |
| JP | 2000-513507 | 10/2000 |
| JP | 2002-118254 | 4/2002 |
| JP | 2002-217413 | 8/2002 |
| JP | 2002-289533 | 10/2002 |
| JP | 2002-359188 | 12/2002 |
| JP | 2003-022970 | 1/2003 |
| KR | 2001-0014201 | 2/2001 |
| KR | 2002-0011338 | 2/2002 |
| WO | WO 98/00857 | 1/1998 |
| WO | WO 98/59365 | 12/1998 |
| WO | WO 03/015140 A1 | 2/2003 |

* cited by examiner

SEMICONDUCTOR SUBSTRATE AND FIELD-EFFECT TRANSISTOR, AND MANUFACTURING METHOD FOR SAME

CROSS REFERENCES TO RELATED APPLICATIONS

This is the U.S. National Stage of International Application No. PCT/JP03/01242, filed on Feb. 6, 2003, which relies for priority upon Japanese Patent Application No. 2003-027596, filed Feb. 4, 2003, the contents of both of which are hereby incorporated by reference in their entireties.

This application is also related to, but does not claim priority from, Japanese Patent Application No. 2001-238172, filed Aug. 6, 2001, Japanese Patent Application No. 2001-253175, filed on Aug. 23, 2001, Japanese Patent Application No. 2001-396966, filed Dec. 27, 2001, and Japanese Patent Application No. 2002-238118, filed on Aug. 19, 2002. All of these related applications are incorporated herein by reference in their entireties.

TECHNICAL FIELD

This invention relates to a semiconductor substrate used in a high-speed MOSFET and similar and to a field effect transistor, as well as to manufacturing methods for both.

BACKGROUND ART

In recent years, high-speed MOSFETs, MODFETs, and HEMTs have been proposed, using as the channel region a strained Si (silicon) layer grown epitaxially on Si substrate with an SiGe (silicon-germanium) layer intervening. In a strained-Si FET, tensile stress arises in the Si layer due to the SiGe, which has larger lattice constants than does Si, and consequently the band structure in the Si changes, state degeneration is removed, and carrier mobilities are increased. Hence by using such a strained Si layer as a channel region, operation can be made faster by a factor of 1.3 to 8 compared with normal devices. Moreover, normal Si substrate grown using the CZ method can be employed as the substrate, so that conventional CMOS processes can be employed to realize high-speed CMOS devices.

However, in order to achieve epitaxial growth of the desired strained Si layer described above as the channel region of a FET, a good-quality SiGe layer must be grown epitaxially on the Si substrate; but differences in the lattice constants of Si and SiGe have resulted in crystallinity-related problems such as dislocations. Consequently in the past there have been various proposals such as the following.

Methods which have been proposed include, for example, a method of using a buffer layer in which the Ge (germanium) composition ratio of the SiGe is changed with a constant gradual gradient; a method of using a buffer layer in which the Ge composition ratio is changed in steps (step-shape); a method of using a buffer layer in which the Ge composition ratio is changed in the manner of a superlattice; and a method in which a Si off-cut wafer is used, and a buffer layer is used in which the Ge composition ratio is changed with a constant gradient.

Patent References are as follows.
Patent Reference 1: U.S. Pat. No. 6,107,653
Patent Reference 2: U.S. Pat. No. 5,442,205
Patent Reference 3: U.S. Pat. No. 5,221,413
Patent Reference 4: International Patent No. 98/00857
Patent Reference 5: Japanese Unexamined Patent Application, First Publication No. 6-252046

However, the following problems remain in the above-described technology of the prior art.

That is, the penetrating dislocation density and surface roughness of a SiGe layer deposited using the above-described conventional art does not attain the level desired for use in devices and manufacturing processes.

For example, when using a buffer layer in which the Ge composition ratio has a gradient, the penetrating dislocation density can be made comparatively low, but there is the problem that the surface roughness worsens; conversely, when using a buffer layer in which the Ge composition ratio is changed in a step-like fashion, the surface roughness can be made comparatively small, but there is the problem that the penetrating dislocation density increases. Further, when an off-cut wafer is used, dislocations tend to emerge laterally rather than in the film thickness direction, but a sufficiently low dislocation density is not achieved. And with respect to surface roughness also, the level required by photolithography processes in the manufacture of LSI and other devices in recent years has not been attained.

DISCLOSURE OF INVENTION

The invention was devised in light of the above problems, and has as an object the provision of a semiconductor substrate and field effect transistor, as well as manufacturing methods for these, enabling a low penetrating dislocation density as well as reduction of the surface roughness to a level enabling actual use.

A semiconductor substrate manufacturing method of the invention is a method of manufacturing a semiconductor substrate in which an SiGe layer is grown epitaxially on Si substrate, comprising:

a first layer formation process of epitaxially growing a first SiGe layer on the Si substrate;

a second layer formation process of epitaxially growing a second SiGe layer either directly onto the first SiGe layer, or with an epitaxially grown Si layer intervening;

a heat treatment process of performing heat treatment, either during or after formation by epitaxial growth of the SiGe layers, at a temperature exceeding the epitaxial growth temperature; and a polishing process of removing by polishing the irregularities in the surface which have been caused by the heat treatment after the SiGe layer formation; and wherein in the first layer formation process, the film thickness of the first SiGe layer is set to be thinner than twice the critical film thickness, which is the film thickness at which dislocations arise and lattice relaxation occurs due to increasing film thickness; and in the second layer formation process, the Ge composition ratio in the second SiGe layer is, at least at the contact face with the first SiGe layer or with the Si layer, set lower than the maximum value of the Ge composition ratio in the first SiGe layer, and moreover a gradient composition region is formed in in at least a portion of which the Ge composition ratio rises gradually in moving toward the surface, to resolve the above problems.

In the invention, it is preferable that in the first layer formation process the Ge composition ratio x in the first SiGe layer be constant, and that the thickness of the first SiGe layer be set to less than twice the critical thickness $t_c$ satisfying the following equation:

$$t_c(\text{nm})=(1.9\times10^{-3}/\epsilon(x)^2)\cdot\ln(t_c/0.4)$$

$$\epsilon(x)=(a_0+0.200326x+0.026174x^2)/a_0$$

$a_0=0.543$ nm ($a_0$ is the Si lattice constant)

In the invention, it is preferable that the second SiGe layer be positioned directly on top of the first SiGe layer, and that the entire layer be a gradient composition layer in which the Ge composition ratio gradually increases in moving toward the surface.

As the first SiGe layer of the invention, means can be adopted in which the Ge composition ratio x is 0.05 or greater and 0.3 or less.

The invention relates to a method of manufacturing a semiconductor substrate in which a strained Si layer is formed on Si substrate with an SiGe layer intervening, and in which a strained Si layer can be grown epitaxially, either directly onto the second SiGe layer of a semiconductor substrate manufactured by the semiconductor substrate manufacturing method described above, or with an SiGe layer intervening.

A semiconductor substrate manufacturing method of the invention is a method of manufacturing a semiconductor substrate in which an SiGe layer is grown epitaxially on Si substrate, comprising:

a first layer formation process of epitaxially growing a first SiGe layer on the Si substrate;

a second layer formation process of epitaxially growing a second SiGe layer either directly onto the first SiGe layer, or with an epitaxially grown Si layer intervening;

a heat treatment process of performing heat treatment, either during or after formation by epitaxial growth of the SiGe layers, at a temperature exceeding the epitaxial growth temperature; and a polishing process of removing by polishing the irregularities in the surface which have been caused by the heat treatment after the SiGe layer formation; and wherein in the first layer formation process, the film thickness of the first SiGe layer is set to be thinner than twice the critical film thickness, which is the film thickness at which dislocations arise and lattice relaxation occurs due to increasing film thickness;

in the second layer formation process, a process of epitaxially growing an SiGe gradient composition layer with Ge composition ratio increased gradually toward the surface and a process of epitaxially growing an SiGe constant-composition layer on the gradient composition layer at the final Ge composition ratio of the gradient composition layer are repeated in alternation a plurality of times at continuous Ge composition ratios, to deposit the second SiGe layer with Ge composition ratio changing in step-like fashion and having a gradient in the deposition direction; and the Ge composition ratio at the bottom face of the second SiGe layer is made lower than the maximum value of the Ge composition ratio in the first SiGe layer, to resolve the above problems.

In the invention, it is preferable that in the first layer formation process the Ge composition ratio x in the first SiGe layer be constant, and that the thickness of the first SiGe layer be set to less than twice the critical thickness $t_c$ satisfying the following equation:

$$t_c(\text{nm})=(1.9\times10^{-3}/\epsilon(x)^2)\cdot\ln(t_c/0.4)$$

$$\epsilon(x)=(a_0+0.200326x+0.026174x^2)/a_0$$

$a_0=0.543$ nm ($a_0$ is the Si lattice constant)

As the first SiGe layer of the invention, means can be adopted in which the Ge composition ratio x is 0.05 or greater and 0.3 or less.

The invention relates to a method of manufacturing a semiconductor substrate in which a strained Si layer is formed on Si substrate with an SiGe layer intervening, and in which a strained Si layer can be grown epitaxially, either directly onto the second SiGe layer of a semiconductor substrate manufactured by any of the semiconductor substrate manufacturing methods described above, or with an SiGe layer intervening.

A semiconductor substrate of the invention comprises a Si substrate, a first SiGe layer on the Si substrate, and a second SiGe layer positioned either directly on top of the first SiGe layer or with an Si layer intervening;

the first SiGe layer has a film thickness less than twice the critical film thickness at which dislocations arise and lattice relaxation occurs due to increasing film thickness; and the Ge composition ratio in the second SiGe layer is, at least at the contact face with the first SiGe layer or with the Si layer, set lower than the maximum value of the Ge composition ratio in the first SiGe layer, and moreover a gradient composition region is formed, in at least a portion of which, the Ge composition ratio rises gradually in moving toward the surface; so that, through manufacture by means of the above semiconductor substrate manufacturing method, the above problems are resolved.

In the invention, it is preferable that in the first SiGe layer the Ge composition ratio x be constant, and that the thickness of the first SiGe layer be set to less than twice the critical thickness $t_c$ satisfying the following equation:

$$t_c(\text{nm})=(1.9\times10^{-3}/\epsilon(x)^2)\cdot\ln(t_c/0.4)$$

$$\epsilon(x)=(a_0+0.200326x+0.026174x^2)/a_0$$

$a_0=0.543$ nm ($a_0$ is the Si lattice constant)

As the first SiGe layer of the invention, means can be adopted in which the Ge composition ratio x is 0.05 or greater and 0.3 or less.

The second SiGe layer of the invention can be positioned directly on top of the first SiGe layer, and the entire layer can be a gradient composition layer in which the Ge composition ratio gradually increases in moving toward the surface.

In the invention, it is preferable that the substrate comprise a strained Si layer, either directly on top of the second SiGe layer of the semiconductor substrate, or with an SiGe layer intervening.

A semiconductor substrate of the invention comprises a Si substrate, a first SiGe layer on the Si substrate, and a second SiGe layer positioned either directly on top of the first SiGe layer or with an Si layer intervening;

the first SiGe layer has a film thickness less than twice the critical film thickness at which dislocations arise and lattice relaxation occurs due to increasing film thickness;

the second SiGe layer is configured by stacking repeatedly and in alternation, and such that the Ge composition ratio is continuous, a SiGe gradient composition layer, the Ge composition ratio in which increases gradually toward the surface, and a SiGe constant-composition layer positioned on top of the gradient composition layer, with Ge composition ratio equal to that at the top surface of the gradient composition layer;

the Ge composition ratio at the bottom face of the second SiGe layer is set lower than the maximum value of the Ge composition ratio in the first SiGe layer; and, through manufacture by means of the above semiconductor substrate manufacturing method, the above problems are resolved.

In the invention, it is preferable that in the first SiGe layer the Ge composition ratio x be constant, and that the thickness of the first SiGe layer be set to less than twice the critical thickness $t_c$ satisfying the following equation:

$$t_c(\text{nm}) = (1.9 \times 10^{-3}/\epsilon(x)^2) \cdot \ln(t_c/0.4)$$

$$\epsilon(x) = (a_0 + 0.200326x + 0.026174x^2)/a_0$$

$a_0 = 0.543$ nm ($a_0$ is the Si lattice constant)

As the first SiGe layer of the invention, means can be adopted in which the Ge composition ratio x is 0.05 or greater and 0.3 or less.

In the invention, the substrate can comprise a strained Si layer, positioned either directly on top of the second SiGe layer of the semiconductor substrate, or with another SiGe layer intervening.

A field effect transistor manufacturing method of the invention is a method of manufacturing a field effect transistor the channel region of which is formed in a strained Si layer grown epitaxially on an SiGe layer, and in which the channel region is formed in the strained Si layer of a semiconductor substrate manufactured by the above-described semiconductor substrate manufacturing method, to resolve the above problems.

A field effect transistor of the invention is a field effect transistor the channel region of which is formed in a strained Si layer grown epitaxially on an SiGe layer, and manufactured by the above-described field effect transistor manufacturing method, to resolve the above problems.

A semiconductor substrate manufacturing method of the invention has a first layer formation process, a second layer formation process, a heat treatment process, and a polishing process, and the film thickness of the first SiGe layer is set thinner than twice the critical film thickness which is the dislocations arise and lattice relaxation occurs due to increasing film thickness, and the Ge composition ratio in the second SiGe layer is, at least at the contact face with the first SiGe layer or with the Si layer, set lower than the maximum value of the Ge composition ratio in the first SiGe layer, and moreover at least a portion of the second SiGe layer has a gradient composition region in which the Ge composition ratio gradually increases toward the surface; hence dislocations can be caused to concentrate efficiently near the interface between the Si substrate and the first SiGe layer and near the interface between the first SiGe layer and the second SiGe layer, so that the penetrating dislocation density and surface roughness at the surface of the second SiGe layer can be reduced; moreover, heat treatment is performed, either during or after formation of an SiGe layer by epitaxial growth, at a temperature exceeding the epitaxial growth temperature, and irregularities in the surface caused by heat treatment after SiGe layer formation are removed by polishing, so that a thermal history is imparted to the substrate in advance, worsening of the surface roughness due to lattice relaxation and dislocation movement is induced in advance and irregularities due to surface roughness worsening are removed by polishing, so that a flat surface is obtained. Hence even when heat treatment is applied to the substrate during device manufacturing processes, the reoccurrence of worsening of roughness at the surface and at interfaces can be prevented.

The above heat treatment process and polishing process can be performed during or after layer formation in either the first layer formation process or in the second layer formation process.

Because the first SiGe layer is formed to a thickness less than twice the critical film thickness, the strain energy increases with the film thickness during deposition of the first SiGe layer, but almost no dislocations occur. Then, when epitaxial growth of the second SiGe layer is begun, because strain energy is already accumulated in the first SiGe layer, the generation and growth of dislocations in the stage in which the second SiGe layer is thin begins from the interface on the side of the first SiGe layer and within the second SiGe layer from the side of the first SiGe layer, and lattice relaxation in the first SiGe layer and in the second SiGe layer begins. At this time, the Ge composition ratio in the second SiGe layer is, at the contact face with the first SiGe layer or with the Si layer, lower than the maximum value of the Ge composition ratio in the first SiGe layer, so that dislocations are generated concentrated along the interface on the side of the first SiGe layer, the generation of dislocations at the interface on the side of the first SiGe layer assists lattice relaxation in the second SiGe layer, and generation and growth of dislocations within the second SiGe layer are suppressed, while in addition worsening of the surface roughness in the second SiGe layer surface is suppressed.

In the gradient composition regions of the second SiGe layer, dislocations are generated uniformly and mutual entangling of dislocations occurs, and the dislocation density in a gradient composition region declines, while in addition dislocation growth is induced in horizontal directions, so that the penetrating dislocation density in the surface region is lowered and worsening of the surface roughness is suppressed.

In a conventional gradient composition region without a first SiGe layer, when the film thickness of the gradient composition region increases beyond a prescribed film thickness and exceeds the critical film thickness dislocation generation begins, and when after an increase in dislocation density a gradient composition region is again formed, the above-described advantageous results are obtained. That is, in a structure of the prior art the above advantageous results are obtained only in a partial region on the upper side of the gradient composition region.

On the other hand, in the structure of the invention having a first SiGe layer, strain energy is already accumulated in the first SiGe layer, so that in the stage in which the second SiGe layer thickness is thin the generation of dislocations begins within the second SiGe layer, so that the above advantageous results are obtained throughout the gradient composition region within the second SiGe layer, the penetrating dislocation density in the surface region of the second SiGe layer is reduced, and worsening of surface roughness is suppressed.

Further, the first SiGe layer functions as a layer to remove impurities at the Si substrate surface such as water, oxygen, and carbon components, with the advantageous result that defects arising from surface contamination of the Si substrate are suppressed.

If dislocations begin to be generated during deposition of the first SiGe layer, the dislocations begin to grow in numerous directions, and so it becomes difficult to suppress the directions of growth of the dislocations, and it is difficult to reduce the penetrating dislocation and surface roughness. Hence it is necessary to set the thickness of the first SiGe film within the range not exceeding twice the critical film thickness, to a thickness smaller than the film thickness at which dislocation generation and lattice relaxation actually begin to be prominent. At the same time, it is more advantageous for the thickness of the first SiGe layer to be closer to the film thickness at which dislocation generation and lattice relaxation actually begin to be prominent. The film thickness at which dislocation generation and lattice relaxation actually begin to be prominent differs depending on the film deposition temperature conditions and other factors. Under these various film deposition conditions, and within the range in which twice the critical film thickness is not exceeded, it is sufficient to select a film thickness close to the film thickness at which dislocation generation and lattice relaxation actually begin to be prominent, and at which the advantageous results of the invention can be obtained.

As explained above, for the semiconductor substrate and semiconductor substrate manufacturing method of the invention the Ge composition ratio in the first SiGe layer is constant, so that at the same Ge composition ratio the film thickness at which dislocation generation and lattice relaxation actually begin to be prominent is extremely thin, and the advantageous results of the invention are obtained for an extremely thin film thickness, with the merit that the time required for film deposition is short. Further, for this semiconductor substrate and semiconductor substrate manufacturing method, by setting the thickness of the first SiGe layer to less than twice the critical film thickness $t_c$ (the film thickness at which dislocations are generated and lattice relaxation occurs, calculated from the Ge composition ratio and lattice constant only, and independent of the film deposition temperature) satisfying the above-described relation, the film thickness of the first SiGe layer can easily be set to within the thickness at which dislocation generation and lattice relaxation actually begin to be prominent.

That is, the film thickness at which dislocation generation and lattice relaxation actually begin to be prominent changes depending on the film deposition temperature, and so if the film thickness is set to less than twice the ideal critical film thickness $t_c$ determined theoretically from the Ge composition ratio x and the lattice constant alone, the film thickness will be smaller than the thickness at which dislocation generation and lattice relaxation actually begin to be prominent, and the advantageous results of the invention can be obtained. The above critical film thickness assumes film deposition in an equilibrium state, and so is determined only by the Ge composition ratio and the lattice constant, independently of the film deposition temperature; but the thickness at which dislocation generation and lattice relaxation actually begin to be prominent also includes cases in which film deposition is performed not in an equilibrium state, but in low-temperature growth or another non-equilibrium state, and is determined according to the film deposition temperature.

As explained above, in the semiconductor substrate and semiconductor substrate manufacturing method of the invention, the Ge composition ratio x in the first SiGe layer is 0.05 or greater and 0.3 or less, so that the film thickness at which dislocation generation and lattice relaxation actually begin to be prominent is not too thin or too thick, and the advantageous results of the invention can be effectively obtained for an appropriate thickness of the first SiGe layer.

That is, when the Ge composition ratio x of the first SiGe layer is smaller than 0.05, the film thickness at which dislocation generation and lattice relaxation actually begin to be prominent becomes too thick, so that the time required for deposition of the first SiGe layer is long, and the surface roughness of the first SiGe layer is worsened.

On the other hand, if the Ge composition ratio x of the first SiGe layer is greater than 0.3, dislocation generation and lattice relaxation actually begin to be prominent at very small film thicknesses, so that it becomes difficult to form the first SiGe layer with good controllability.

Also, if the Ge composition ratio x of the first SiGe layer is 0.05 or greater and 0.3 or less, the film thickness at which dislocation generation and lattice relaxation actually begin to be prominent is an appropriate thickness, dislocations are generated concentrated along the interfaces on both sides of the first SiGe layer, and the generation of dislocations at the interfaces on both sides of the first SiGe layer effectively brings about the advantageous result of assisting lattice relaxation in the second SiGe layer.

In these semiconductor substrates and semiconductor substrate manufacturing methods, the second SiGe layer is positioned directly on top of the first SiGe layer, and moreover the entire layer comprises a gradient composition layer in which the Ge composition ratio increases gradually toward the surface, so that the layers necessary to obtain the advantageous results of the invention are positioned without waste, the advantageous results of the invention are obtained for the thinnest film thickness, and there is the merit that the time required for film deposition is short.

In a semiconductor substrate and semiconductor substrate manufacturing method of the invention, the film thickness of the first SiGe layer is set to less than twice the critical film thickness which is the film thickness at which dislocation generation and lattice relaxation actually begin to be prominent as the film thickness is increased, and the Ge composition ratio at the bottom face of the second SiGe layer is set lower than the maximum value of the Ge composition ratio in the first SiGe layer, so that dislocations can be effectively concentrated near the interface between the Si substrate and the first SiGe layer and near the interface between the first SiGe layer and the second SiGe layer, the penetrating dislocation density and surface roughness at the surface of the second SiGe layer can be reduced. Moreover, heat treatment is performed during or after SiGe layer formation by epitaxial growth, at a temperature exceeding the epitaxial growth temperature, after which irregularities in the surface arising from heat treatment after the SiGe layer formation are removed by polishing, so that a thermal history is imparted to the substrate in advance, and worsening of the surface roughness due to lattice relaxation and dislocation movement are caused in advance and the irregularities due to worsening of the surface roughness are removed by polishing to obtain a flat surface. Hence even if the substrate is subjected to heat treatment in device manufacturing processes or similar, reoccurrence of roughness worsening at the surface and at interfaces can be prevented.

Here, the first SiGe layer is deposited to a thickness which is less than twice the critical film thickness, and so while the strain energy is large during the first SiGe layer deposition in accordance with the film thickness, there is almost no generation of dislocations. Next, when epitaxial growth of the second SiGe layer is begun, because strain energy has already accumulated in the first SiGe layer, dislocation generation and growth begins from the interface on the both side of the first SiGe layer and from the side near the first SiGe layer in the second SiGe layer in the stage in which the second SiGe layer is still thin, and lattice relaxation begins in the first SiGe layer and in the second SiGe layer. At this time, the Ge composition ratio in the second SiGe layer is lower than the maximum value of the Ge composition ratio in the first SiGe layer or in the first SiGe layer at the contact face with the Si layer, so that dislocations are generated concentrated along the interface on the side of the first SiGe layer, and generation of dislocations at the interfaces on both sides of the first SiGe layer assist lattice relaxation in the second SiGe layer, so that dislocation generation and growth in the second SiGe layer are suppressed, and worsening of surface roughness at the surface of the second SiGe layer is also suppressed.

Further, the first SiGe layer functions as a layer to remove impurities at the Si substrate surface such as water, oxygen, and carbon components, with the advantageous result that defects arising from surface contamination of the Si substrate are suppressed.

When dislocations begin to be generated during deposition of the first SiGe layer, the dislocations begin to grow in numerous directions, and so it becomes difficult to suppress the directions of growth of the dislocations, and it is difficult to reduce the penetrating dislocation and surface roughness. Hence it is necessary to set the thickness of the first SiGe film within the range not exceeding twice the critical film thickness, to a thickness smaller than the film thickness at which dislocation generation and lattice relaxation actually begin to be prominent. At the same time, it is more advantageous for the thickness of the first SiGe layer to be closer to the film thickness at which dislocation generation and lattice relaxation actually begin to be prominent. The film thickness at which dislocation generation and lattice relaxation actually begin to be prominent differs depending on the film deposition temperature conditions and other factors. Under these various film deposition conditions, and within the range in which twice the critical film thickness is not exceeded, it is sufficient to select a film thickness close to the film thickness at which dislocation generation and lattice relaxation actually begin to be prominent, and at which the advantageous results of the invention can be obtained.

Further, the second SiGe layer is formed by stacking repeatedly and in alternation, and such that the Ge composition ratio is continuous, a SiGe gradient composition layer, the Ge composition ratio in which increases gradually toward the surface, and a SiGe constant-composition layer positioned on top of the gradient composition layer, with Ge composition ratio equal to that at the top surface of the gradient composition layer; hence the Ge composition ratio of the entire second SiGe layer changes in a step-like fashion, and dislocations tend to run in horizontal directions at interfaces, so that penetrating dislocations tend not to occur; in addition, the composition change at the interface is small, so that dislocation occurrence at the interface is suppressed, dislocations are generated uniformly within the gradient composition layer, and worsening of surface roughness can be suppressed.

These inventors have conducted research on techniques of SiGe film fabrication, and as a result have found that dislocations in the crystal have the following tendencies.

That is, when depositing an SiGe layer, dislocations occurring during deposition have the property of tending to run in either an oblique direction with respect to the film deposition direction, or in a horizontal direction (a direction orthogonal to the film deposition direction: a <110> direction). Further, dislocations tend to run in horizontal directions at layer interfaces, but at interfaces at which the composition changes abruptly, dislocations tend to run obliquely upward, and it is thought that numerous dislocations occur at high density.

Hence when film is deposited with the Ge composition ratio in a simple step-like shape, numerous dislocations occur at high density at interface portions, at which abrupt composition changes occur; in addition, dislocations tend to run in directions oblique with respect to the film deposition direction, and it is though that such dislocations may become penetrating dislocations. Moreover, when film is deposited such that the Ge composition ratio changes with a simple gradual gradient, there are no portions (such as interfaces) at which dislocations running in oblique directions can escape in horizontal directions, as so such directions are thought to penetrate to the surface.

On the other hand, in a semiconductor substrate manufacturing method of the invention, the second SiGe layer is deposited by repeating in alternation, and such that the Ge composition ratio is continuous, a process of epitaxial growth of an SiGe gradient composition layer, the Ge composition ratio in which increases gradually toward the surface, and a process of epitaxial growth of an SiGe constant-composition layer positioned on top of the gradient composition layer, with the final Ge composition ratio of the gradient composition layer, so that the Ge composition ratio changes in a step-like fashion in the film deposition direction; hence a plurality of gradient composition layers and constant-composition layers are formed in alternation to obtain a layer in which the Ge composition ratio has a gradient-step shape, so that an SiGe layer can be formed with low dislocation density and small surface roughness.

That is, dislocations tend to run in horizontal directions at interfaces, and penetrating dislocations do not readily occur. Further, composition changes at interfaces are small, so that dislocation occurrence at interfaces is suppressed, dislocations are generated uniformly within gradient composition layers, and worsening of surface roughness can be suppressed.

In the gradient composition regions of the second SiGe layer, dislocations are generated uniformly and mutual entangling of dislocations occurs, and the dislocation density in a gradient composition region declines, while in addition dislocation growth is induced in horizontal directions, so that the penetrating dislocation density in the surface region is lowered and worsening of the surface roughness is suppressed.

In a conventional gradient composition region without a first SiGe layer, when the film thickness of the gradient composition region increases beyond a prescribed film thickness and exceeds the critical film thickness dislocation generation begins, and when after an increase in dislocation density a gradient composition region is again formed, the above-described advantageous results are obtained. That is, in a structure of the prior art the above advantageous results are obtained only in a partial region on the upper side of the gradient composition region.

On the other hand, in the structure of the invention having a first SiGe layer, strain energy is already accumulated in the first SiGe layer, so that in the stage in which the second SiGe layer thickness is thin the generation of dislocations begins within the second SiGe layer, so that the above advantageous results are obtained throughout the gradient composition region within the second SiGe layer, the penetrating dislocation density in the surface region of the second SiGe layer is reduced, and worsening of surface roughness is suppressed.

In the above semiconductor substrates and semiconductor substrate manufacturing methods, a strained Si layer is grown epitaxially either directly onto the SiGe layer, or with another SiGe layer intervening, so that there are few defects, a good-quality strained Si layer with little surface roughness is obtained, and after the polishing process the strained Si layer is grown epitaxially either directly onto the SiGe layer or with another SiGe layer intervening, so that the Si layer is deposited onto a SiGe layer with a satisfactory surface state and a good-quality strained Si layer is obtained. The semiconductor substrate and manufacturing method are thus suitable for use with integrated circuits using MOSFETs or similar, the channel regions of which are formed in the strained Si layer.

In the above field effect transistor and field effect transistor manufacturing methods, channel regions are formed in the strained Si layer of a semiconductor substrate of the invention or of a semiconductor substrate manufactured by a semiconductor substrate manufacturing method of the invention, so that even when heat treatment is applied during device manufacture, a good-quality strained Si layer is obtained on an SiGe layer with a good quality surface state, and field effect transistors with excellent characteristics can be manufactured with high production yields.

BEST MODE FOR CARRYING OUT THE INVENTION

Below, a first embodiment of the invention is explained, based on the drawings.

Figure 1:
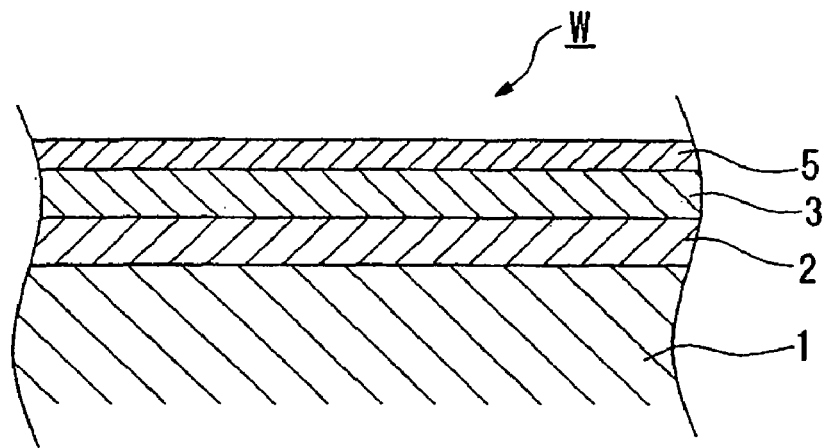
FIG. 1 is a cross-sectional view showing the semiconductor substrate in a first embodiment of the invention.
Figure 2:
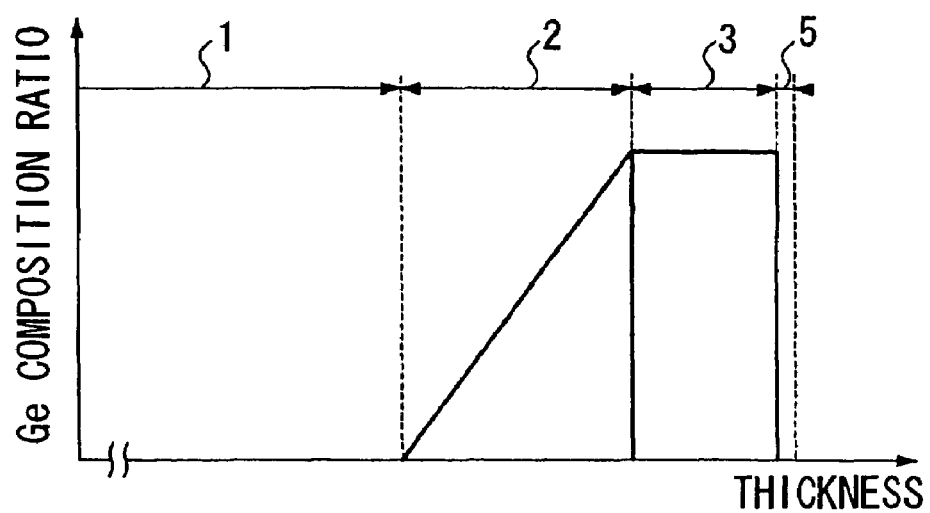
FIG. 2 is a graph showing the Ge composition ratio plotted against the film thickness of the semiconductor substrate comprising a strained Si layer in the first embodiment of the invention.

FIG. 1 shows the cross-sectional structure of a semiconductor wafer (semiconductor substrate) W comprising a strained Si layer; the structure and manufacturing process of the semiconductor wafer W are as follows. First, as shown in FIG. 1 and FIG. 2, a first SiGe layer 2, which is a gradient composition layer (gradient composition region) in which the Ge composition ratio x increases gradually from 0.3 with a gradient in the film deposition direction (toward the surface), is grown epitaxially on Si substrate 1 by a reduced-pressure CVD method. Film deposition by this reduced-pressure CVD method uses $H_2$ as the carrier gas and $SiH_4$ and $GeH_4$ as source gases.

Next, a second SiGe layer 3, which is a constant-composition layer with Ge composition ratio equal to the final Ge composition ratio of the first SiGe layer (0.3) and which moreover is a relaxation layer, is grown epitaxially on the first SiGe layer 2. The first SiGe layer 2 and second SiGe layer 3 together function as an SiGe buffer layer enabling deposition of a strained Si layer.

Figure 3A:
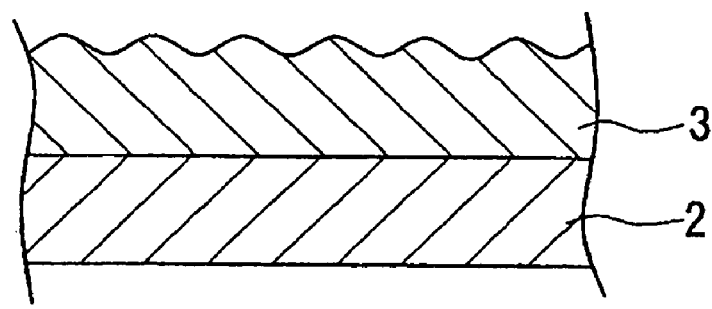
FIGS. 3A to 3C are cross-sectional views showing the order of processes for heat treatment, polishing, and strained Si layer formation in the first embodiment of the invention.

As indicated by FIG. 3A, either during or after formation of the first SiGe layer 2 and second SiGe layer 3, heat treatment is performed, to cause worsening in advance of the surface roughness of the SiGe layer. The conditions for the heat treatment are for example a temperature between 800° C. and 1100° C., exceeding the temperature of epitaxial growth of the SiGe layer, with the heat treatment time set to between 1 minute and 200 minutes. In this embodiment, during deposition of the second SiGe layer 3, supply of the source gas is halted temporarily to stop film deposition, and in this state annealing is performed for 10 minutes with the temperature elevated to 1000° C. After this annealing the temperature of the second SiGe layer 3 is lowered to the film deposition temperature, the source gas is again supplied, and the remainder of the film is deposited.

Figure 3B:
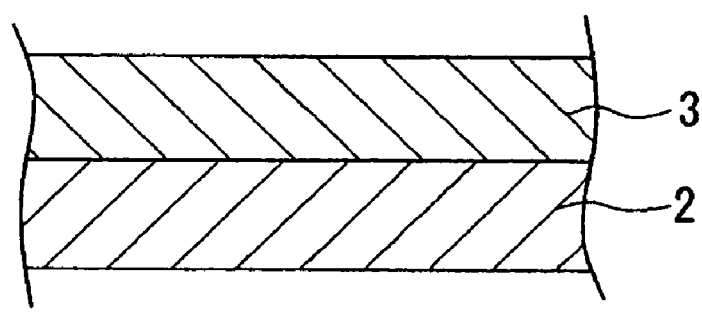

Next, the surface of the second SiGe layer 3, in which irregularities have occurred due to worsening of the surface roughness as a result of the heat treatment, is polished using CMP (Chemical-Mechanical Polishing) or similar, as shown in FIG. 3B, to flatten the surface and remove the irregularities arising from the worsened surface roughness.

The thicknesses of the first SiGe layer 2 and second SiGe layer 3 are for example 1.5 μm and 0.75 μm.

Figure 3C:
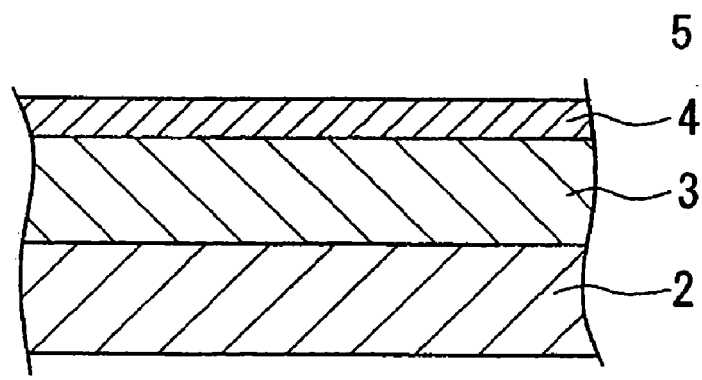

Then, a strained Si layer 5 is formed by epitaxial growth of a Si layer on the polished second SiGe layer 3, as shown in FIG. 3C, to complete fabrication of the semiconductor wafer W.

In this embodiment, either during or after formation by epitaxial growth of the second SiGe layer 3, heat treatment is performed at a temperature exceeding the epitaxial growth temperature, and irregularities in the surface due to heat treatment are removed by polishing after formation of the second SiGe layer 3, so that a thermal history is imparted to the substrate in advance and worsening of surface roughness caused by lattice relaxation and dislocation movement is induced in advance; hence when the substrate is subjected to heat treatment during device manufacturing processes or similar, reoccurrence of worsening of surface roughness at the surface and at interfaces can be prevented.

The first SiGe layer 2 is a gradient composition region in which the Ge composition ratio increases gradually toward the surface; consequently the dislocation density can be suppressed on the surface side in the SiGe layer in particular.

Figure 4:
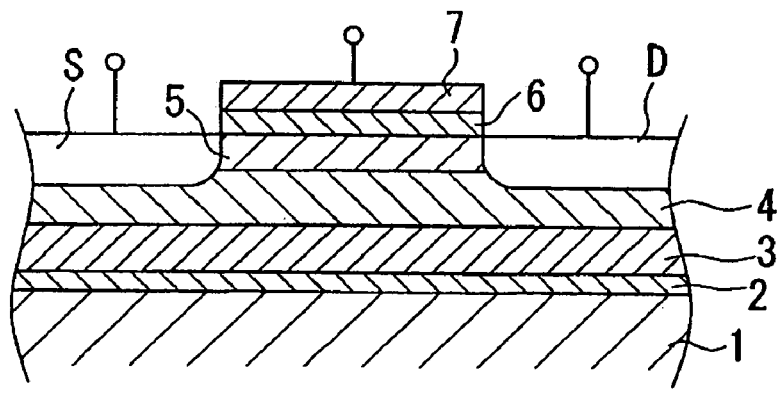
FIG. 4 is a cross-sectional view showing in summary a MOSFET in an embodiment of the invention.

Next, a field effect transistor (MOSFET) of the invention, which uses the semiconductor substrate of the above-described embodiment, is explained, together with the manufacturing processes for the transistor, referring to FIG. 4.

FIG. 4 shows in summary the structure of a field effect transistor of the invention; in order to manufacture this field effect transistor, an $SiO_2$ gate oxide film 6 and gate polysilicon film 7 are deposited in order on the strained Si layer 5 of a semiconductor wafer W comprising a strained Si layer, manufactured by the above-described manufacturing processes. A gate electrode (not shown) is then patterned and formed on the gate polysilicon film 7 on the portion which is to be the channel region.

Next, the gate oxide film 6 is patterned to remove portions other than the portion below the gate electrode. Through ion implantation using the gate electrode as a mask, an n-type or p-type source region S and drain region D are formed, in self-aligned fashion, in the strained Si layer 5 and second SiGe layer 3. Thereafter, a source electrode and drain electrode (not shown) are respective formed on the source region S and drain region D, to complete manufacturing an n-type or p-type MOSFET the channel region of which comprises the strained Si layer 5.

In a MOSFET manufactured in this way, the channel region is formed in the strained Si layer 5 on a semiconductor wafer W comprising a strained Si layer, manufactured by the method described above; hence even if heat treatment is performed during device manufacture, there is no worsening of the surface or interface roughness, and through use of the good-quality strained Si layer 5, MOSFETs with excellent operating characteristics can be obtained with high yields. For example, when forming the gate oxide film 6 the semiconductor wafer W is heated in order to form the thermal oxide film, but because the semiconductor wafer W has been subjected to a thermal history in advance, there is no worsening of roughness at surfaces or interfaces in the SiGe layer or strained Si layer during thermal oxide film formation.

The technical scope of the invention is not limited to the above embodiment, and various modifications can be made within the scope of the invention.

For example, in the above embodiment the SiGe layer heat treatment is performed during formation of the second SiGe layer; but the heat treatment may be performed during formation of the first SiGe layer, or after formation of the second SiGe layer.

The invention also comprises semiconductor wafers having a further SiGe layer on top of the strained Si layer of the semiconductor wafer W comprising a strained Si layer of the above embodiment. Moreover, the strained Si layer is deposited directly onto the second SiGe layer, but another SiGe layer may be deposited on the second SiGe layer, with the strained Si layer grown epitaxially on top with this SiGe layer intervening.

In this embodiment, a semiconductor wafer having an SiGe layer is fabricated for use as a substrate for a MOSFET; but the substrate may be used for other applications as well. For example, a semiconductor substrate of the invention may be applied as a substrate for solar cells. That is, onto the Si substrate of the above-described embodiment is deposited an SiGe layer which is a gradient composition region, in which the Ge composition ratio is gradually increased such that the uppermost surface is 100% Ge, and by then depositing GaAs (gallium arsenide) on top of this, a solar cell substrate may be manufactured. In this case, a solar cell substrate with excellent characteristics and a low dislocation density is obtained.

Below, a second embodiment of the invention is explained based on the drawings.

In this embodiment, the first and second SiGe layers are different from those in the above-described embodiment.

Figure 5:
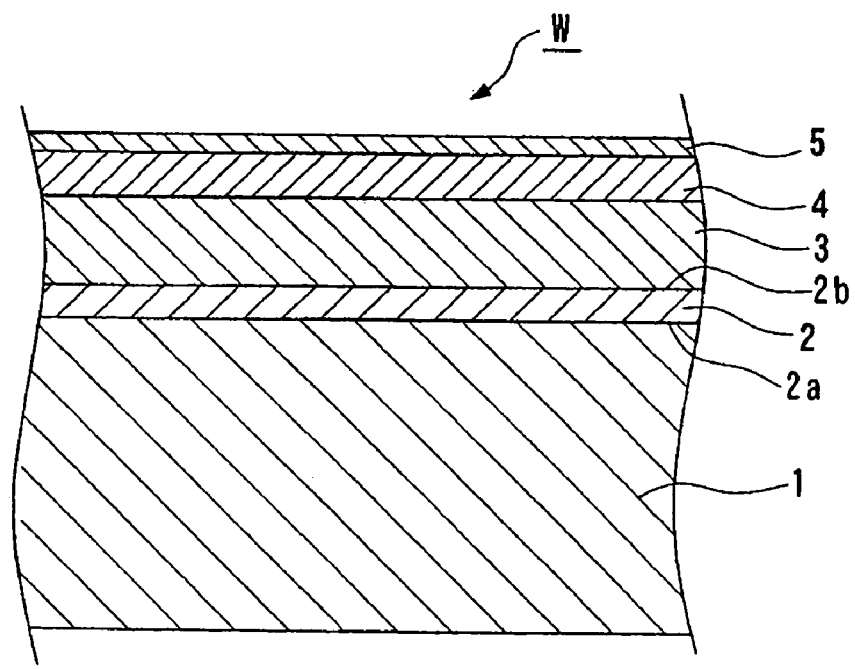
FIG. 5 is a cross-sectional view showing the semiconductor substrate in a second embodiment of the invention.
Figure 6:
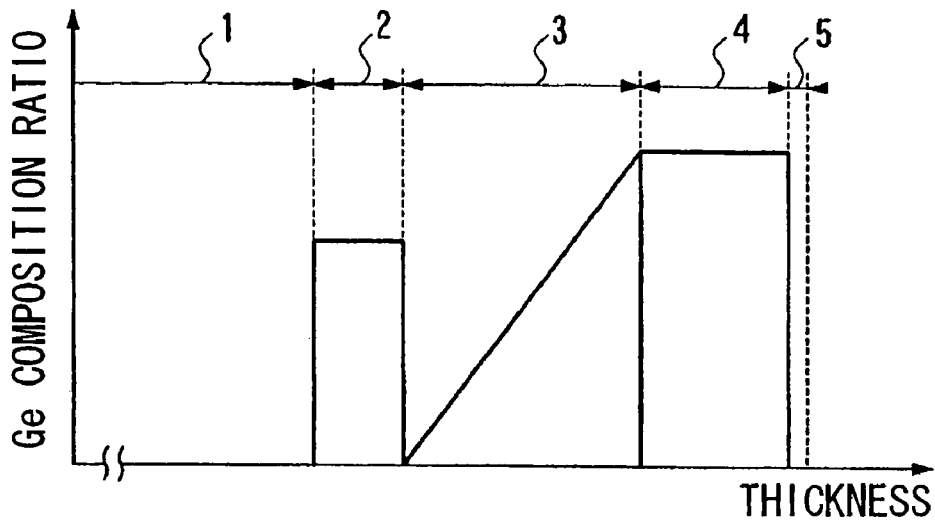
FIG. 6 is a graph showing the Ge composition ratio plotted against the film thickness of the semiconductor substrate in the second embodiment of the invention.

FIG. 5 shows the cross-sectional structure of a semiconductor wafer (semiconductor substrate) W of the invention; the structure and manufacturing process of the semiconductor wafer are as follows. As shown in FIG. 5 and FIG. 6, a first SiGe layer 2 with constant Ge composition ratio x (for example, x=0.15) is grown epitaxially, for example by a reduced-pressure CVD method, to a thickness which is less than the above-explained thickness at which dislocation generation and lattice relaxation actually begin to be prominent (for example, 300 nm), on p-type or n-type Si substrate 1 grown by pulling using the CZ method or similar.

At this time, the first SiGe layer 2 is deposited to a thickness less than the thickness at which dislocation generation and lattice relaxation actually begin to be prominent, so that strain energy increases during deposition of the first SiGe layer 2 according to the film thickness, but there is almost no dislocation generation or lattice relaxation.

The thickness of the first SiGe layer 2 is less than twice the critical thickness $t_c$ satisfying the following equation:

$$t_c(\text{nm})=(1.9\times10^{-3}/\epsilon(x)^2)\cdot\ln(t_c/0.4)$$

$$\epsilon(x)=(a_0+0.200326x+0.026174x^2)/a_0$$

$a_0=0.543$ nm ($a_0$ is the Si lattice constant)

Next, the second SiGe layer 3 is grown epitaxially on the first SiGe layer 2.

In this second SiGe layer 3, the Ge composition ration y is set lower, at least, than the maximum value of the Ge composition ratio x in the first SiGe layer 2 at the face of contact with the first SiGe layer 2. The second SiGe layer 3 is a gradient composition layer (gradient composition region) the Ge composition ratio in which increases gradually toward the surface (a layer in which, for example, the Ge composition ratio y increases from 0 to 0.3), and is deposited to a thickness of for example 11 μm.

Either during or after formation of the first SiGe layer and the second SiGe layer, heat treatment similar to the heat treatment described in (a) of FIG. 3 in the above-described first embodiment is performed, causing a worsening in advance of the surface roughness of the SiGe layers; in addition, the surface of the second SiGe layer 3, on which irregularities appear due to the worsening of the surface roughness resulting from the heat treatment, is polished by CMP or similar as shown in (b) of FIG. 3 in the above-described first embodiment, to flatten the surface and remove the irregularities caused by the worsened surface roughness.

When epitaxial growth of the second SiGe layer 3 is begun, strain energy is already accumulated in the first SiGe layer 2, so that in the stage in which the second SiGe layer 3 is thin, dislocation generation and growth begins from the interfaces on both sides of the first SiGe layer 2 and from the side of the first SiGe layer 2 in the second SiGe layer 3, and lattice relaxation begins in the first SiGe layer 2 and in the second SiGe layer 3. At this time, the Ge composition ratio in the second SiGe layer 3 is lower than the maximum value of the Ge composition ratio in the first SiGe layer 2 at the contact face with the first SiGe layer 2, so that dislocations are generated concentrated along the interfaces 2a, 2b of the first SiGe layer 2, and generation of dislocations at the interfaces 2a, 2b on both sides of the first SiGe layer 2 is assisted by the lattice relaxation in the second SiGe layer 3; generation and growth of dislocations in the second SiGe layer 3 are suppressed, and moreover worsening of the surface roughness at the surface of the second SiGe layer 3 is also suppressed.

Then, an SiGe relaxation layer 4, the Ge composition ratio z of which is the same as the final Ge composition ratio in the second SiGe layer 3 (for example, z=0.3), is grown epitaxially to a prescribed thickness (for example 0.4 μm), and then single-crystal Si is grown epitaxially on the SiGe relaxation layer 4, and upon polishing the strained Si layer 5 to a prescribed thickness (for example 20 nm), manufacture of a semiconductor wafer W of this embodiment is completed.

In film deposition using the reduced-pressure CVD method, $H_2$ is used as the carrier gas, and $SiH_4$ and $GeH_4$ are used as source gases.

In a semiconductor wafer W of this embodiment, similarly to the above-described first embodiment, heat treatment is performed either during or after formation of the second SiGe layer 3 by epitaxial growth, at a temperature exceeding the epitaxial growth temperature, and irregularities in the surface due to heat treatment are removed by polishing after formation of the second SiGe layer 3, so that a thermal history is imparted to the substrate in advance, and worsening of the surface roughness due to lattice relaxation and dislocation movement is induced in advance. Consequently when heat treatment is applied during device manufacturing processes or at other times, reoccurrence of worsening of the roughness at surfaces and interfaces can be prevented. And by setting the film thickness of the first SiGe layer 2 to be less than the film thickness at which dislocation generation and lattice relaxation actually begin to be prominent, and by setting the Ge composition ratio y of the second SiGe layer 3 to less than, at least, the maximum value of the Ge composition ratio x in the first SiGe layer 2 at the contact face with the first SiGe layer 2, dislocations are caused to be concentrated efficiently at the interface 2a between the Si substrate 1 and the first SiGe layer 2 and at the interface 2b between the first SiGe layer 2 and the second SiGe layer 3, so that the penetrating dislocation density and surface roughness can be reduced.

Because the Ge composition ratio in the first SiGe layer 2 is constant, the film thickness at which dislocation generation and lattice relaxation actually begin to be prominent is extremely thin for a given Ge composition ratio, and the advantageous results of the invention can be obtained even for very thin films, with the merit that the time required for film deposition is short.

By making the thickness of the first SiGe layer 2 less than twice the critical film thickness $t_c$ satisfying the above equation, the film thickness of the first SiGe layer 2 can easily be set to within the film thickness at which dislocation generation and lattice relaxation actually begin to be prominent, based on the results of experiments described below.

In this embodiment, by making the second SiGe layer 3 a gradient composition layer (gradient composition region) in which the Ge composition ratio is gradually increased, dislocations are generated uniformly and mutual entangling of dislocations occurs, so that the dislocation density in the second SiGe layer 3 is reduced, the penetrating dislocation density in the surface region is reduced due to the fact that dislocations are induced to grow in horizontal directions, and there is the advantageous result that worsening of the surface roughness is suppressed.

In this embodiment, strain energy is already accumulated in the first SiGe layer 2 before deposition of the second SiGe layer 3, so that dislocation generation begins in the second SiGe layer 3 in the stage in which the second SiGe layer 3 is thin, and consequently the above advantageous results are obtained for the entire gradient composition region in the second SiGe layer 3, the penetrating dislocation density in the surface region of the second SiGe layer 3 is reduced, and worsening of the surface roughness is suppressed.

Moreover, the first SiGe layer 2 functions as a layer to remove water, oxygen and carbon components and other impurities on the surface of the Si substrate 1, with the advantageous result that defects arising from surface contamination of the Si substrate 1 can be suppressed. In this embodiment also, a field effect transistor (MOSFET) using the above semiconductor wafer W can be manufactured, as shown in FIG. 4 in the above-described first embodiment.

Figure 7:
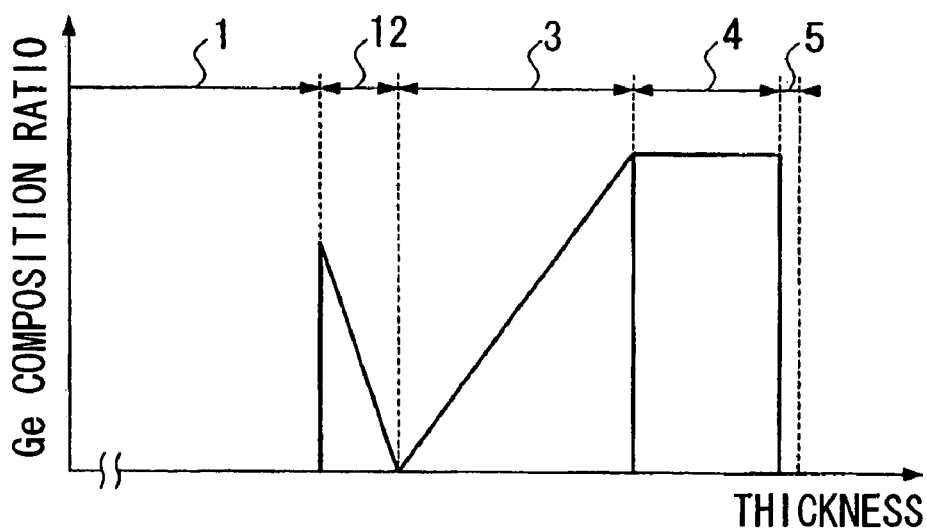
FIG. 7 is a graph showing the Ge composition ratio plotted against the film thickness of the semiconductor substrate in a third embodiment of the invention.

Next, a third embodiment of the invention is explained, based on FIG. 7.

This embodiment and the second embodiment differ in that, in the first SiGe layer 2 of the second embodiment, the Ge composition ratio is set to be constant, whereas in this third embodiment, as shown in FIG. 7, the Ge composition ratio x of the first SiGe layer 12 has its maximum value in the layer at the face of contact with the Si substrate 1, and the Ge composition ratio x is decreased gradually.

In other words, in the process of forming the first SiGe layer 12 in this embodiment, the Ge composition ratio x is set to 0.3 at the time film deposition is begun, and thereafter is gradually decreased until the final Ge composition ratio x is substantially zero, to obtain a gradient composition layer growth to a prescribed thickness (for example, 350 nm) thinner than the film thickness at which dislocation generation and lattice relaxation actually begin to be prominent.

In this embodiment, by causing the maximum value of the Ge composition ratio x in the first SiGe layer 12 to be at the contact face with the Si substrate 1, the strain energy during deposition is concentrated on the side of the interface with the Si substrate 1, and upon lattice relaxation occurring at the start of deposition of the second SiGe layer 3 it is possible to cause numerous dislocations to be generated at the interface with the Si substrate 1, rather than at the interface with the second SiGe layer 3. As a result, dislocations can be concentrated at positions distant from the surface of the second SiGe layer 3, and similarly to the above-described embodiment, penetrating dislocations and surface roughness can be reduced.

Figure 8:
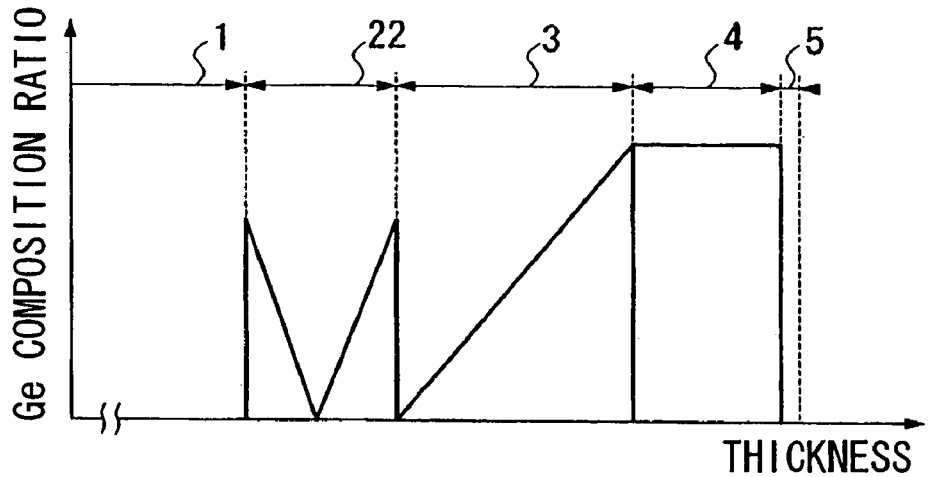
FIG. 8 is a graph showing the Ge composition ratio plotted against the film thickness of the semiconductor substrate in a fourth embodiment of the invention.

Next, a fourth embodiment of the invention is explained, based on FIG. 8.

A difference between this embodiment and the third embodiment is the fact that, whereas the first SiGe layer 12 in the third embodiment is a gradient composition layer in which the Ge composition ratio gradually decreases, in the fourth embodiment, as shown in FIG. 8, the first SiGe layer is a composition-modified layer in which, in the process to form the first SiGe layer 22 the Ge composition ratio x is set to 0.3 at the beginning of film deposition, thereafter is gradually decreased until the Ge composition ratio is substantially zero, and after depositing the film to a prescribed thickness (for example, 350 nm), the Ge composition ratio x is again gradually increased to a final value of 0.3, and film is deposited to a prescribed thickness (for example, 350 nm).

The thickness of this first SiGe layer 22 is also set to be thinner than the thickness at which dislocation generation and lattice relaxation actually begin to be prominent.

In this fourth embodiment also, the Ge composition ratio x in the first SiGe layer 22 has its maximum value in the later at the contact faces with the Si substrate 1 and with the second SiGe layer 3, so that similarly to the second embodiment, numerous dislocations can be caused to be generated at the interfaces with the Si substrate 1 and with the second SiGe layer 3.

Figure 9:
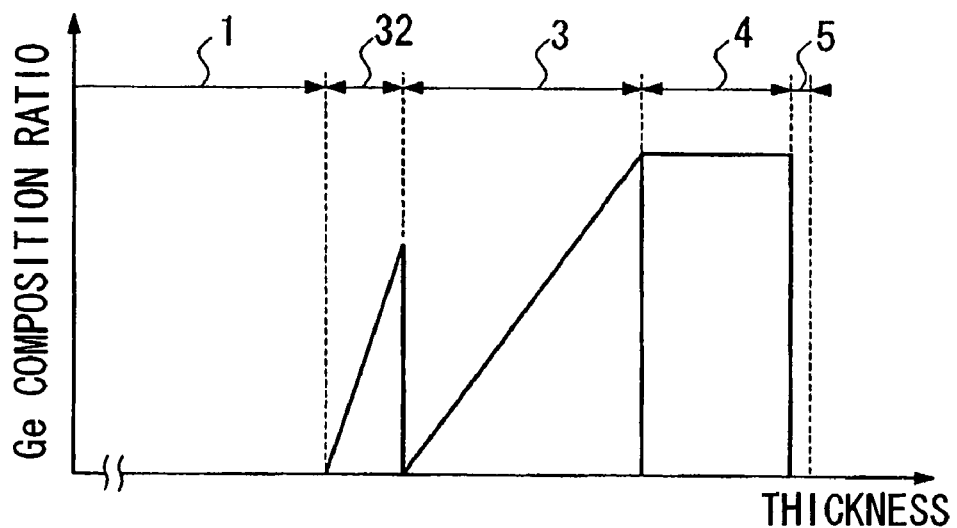
FIG. 9 is a graph showing the Ge composition ratio plotted against the film thickness of the semiconductor substrate in a fifth embodiment of the invention.
Figure 10:
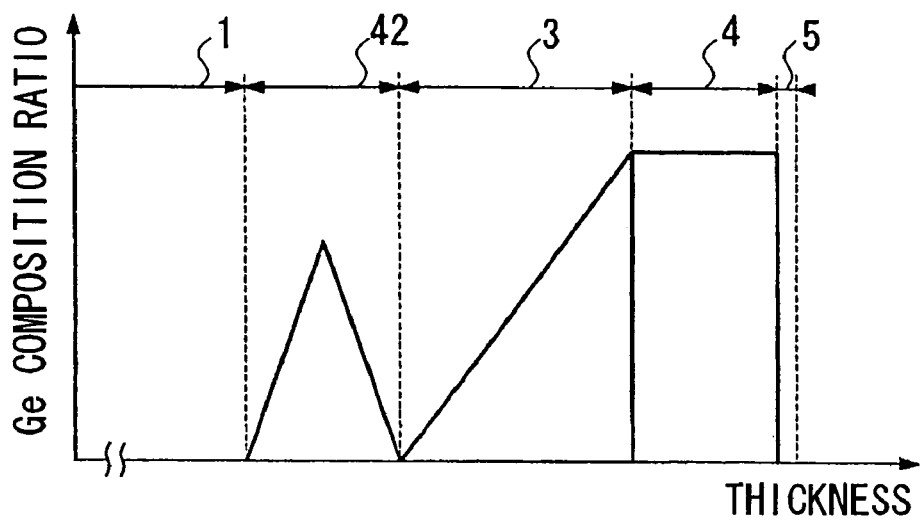
FIG. 10 is a graph showing the Ge composition ratio plotted against the film thickness of the semiconductor substrate in a sixth embodiment of the invention.

Next, a fifth embodiment and sixth embodiment of the invention are explained, based on FIG. 9 and FIG. 10.

A difference between the fifth embodiment and the second embodiment is that, whereas in the first SiGe layer 2 of the second embodiment the Ge composition ratio was set to a constant value, in the fifth embodiment the Ge composition ratio x in the first SiGe layer 32 is increased slowly from substantially zero up to 0.3 while depositing the film to a prescribed thickness which is thinner than the film thickness at which dislocation generation and lattice relaxation actually begin to be prominent (for example, 350 nm), as shown in FIG. 9.

A difference between the sixth embodiment and the second embodiment is that, whereas in the first SiGe layer 2 of the second embodiment the Ge composition ratio was set to a constant value, in the sixth embodiment the Ge composition ratio x in the first SiGe layer 42 is increased slowly from substantially zero up to 0.3 while depositing a prescribed thickness (for example, 350 nm), after which the Ge composition ratio x is decreased slowly from 0.3 to substantially zero while depositing a prescribed thickness (for example, 350 nm). The thickness of the first SiGe layer 42 is set to be thinner than the film thickness at which dislocation generation and lattice relaxation actually begin to be prominent.

These fifth and sixth embodiments afford advantageous results similar to those of the previous embodiments, and in both cases the first SiGe layers 32, 42 are formed to a film thickness which is thinner than the film thickness at which dislocation generation and lattice relaxation actually begin to be prominent, so that during deposition of the second SiGe layer 3, dislocations are concentrated at the interfaces on both sides of the first SiGe layer 32 and 42, and penetrating dislocations and surface roughness can be reduced. In the fifth and sixth embodiments, the maximum value of the Ge composition ratio in the first SiGe layer 32 and 42 is not at the interface with the Si substrate 1, and consequently a greater effect in improvement with respect to penetrating dislocations and surface roughness is obtained in the second and third embodiments.

In the above second through sixth embodiments, five different distributions of the Ge composition ratio in the depth direction in the first SiGe layer are adopted; but other distributions may be employed. For example, the first SiGe layer may be a multilayer film comprising a plurality of SiGe layers with different Ge composition ratios. Also, the multilayer film may be a multilayer film comprising Si layers.

In each of the above embodiments, when the Ge composition ratio is changed within the first SiGe layer, the composition was changed at a constant rate with respect to the film thickness; but a structure may be employed in which the rate is not constant. Further, the first SiGe layer need only be a layer comprising Ge which accumulates strain energy; any other Ge composition ratio distribution may be employed. Also, in each of the above embodiments the second SiGe layer is a gradient composition region in which the Ge composition ratio is increased gradually toward the surface, and the composition is changed at a constant rate with respect to the film thickness; but a structure may be adopted in which the rate is not constant. Further, the Ge composition ratio change may be such that the composition gradients are step-shaped. In each of the above embodiments, the second SiGe layer is positioned directly on the first SiGe layer, but the second SiGe layer may be positioned with an Si layer intervening. Also, another SiGe layer may be deposited on the strained Si layer of the semiconductor wafer W in each of the above embodiments.

Next, a seventh embodiment of the invention is explained, based on the drawings.

Figure 11:
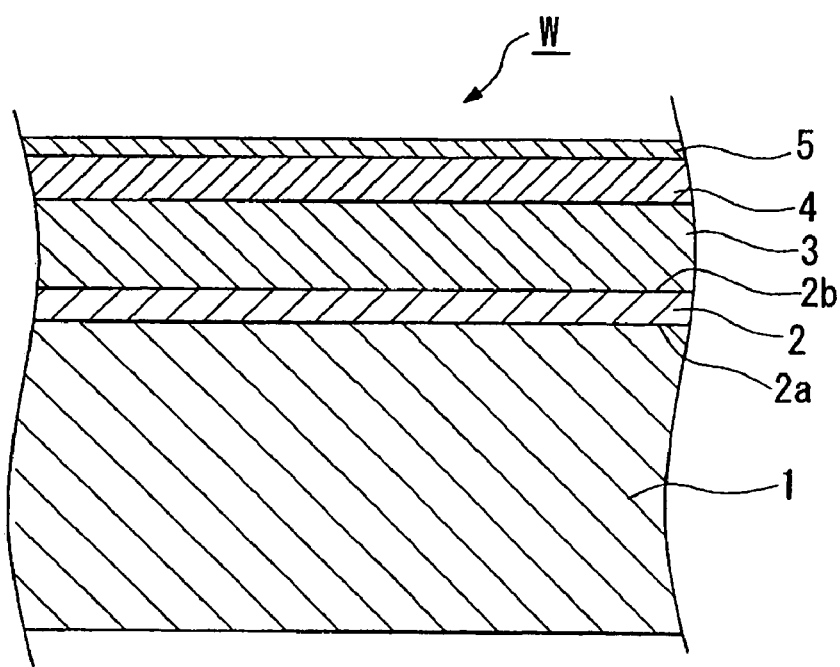
FIG. 11 is a cross-sectional view showing the semiconductor substrate in a seventh embodiment of the invention.
Figure 12:
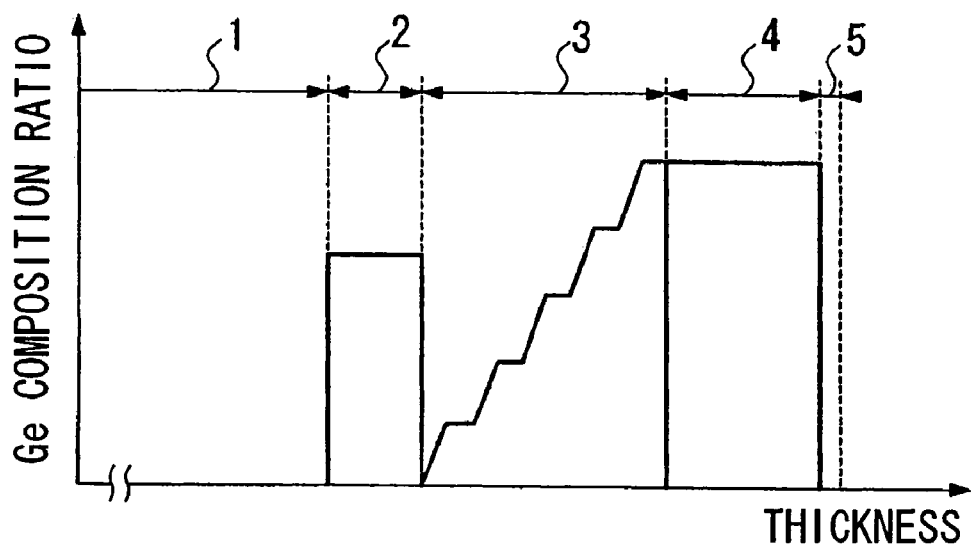
FIG. 12 is a graph showing the Ge composition ratio plotted against the film thickness of the semiconductor substrate in the seventh embodiment of the invention.

FIG. 11 shows the cross-sectional structure of a semiconductor wafer (semiconductor substrate) W of this embodiment; the structure and manufacturing process of the semiconductor wafer W are as follows. First, reduced-pressure CVD, for example, is used in the epitaxial growth of the first SiGe layer 2, the Ge composition ratio x of which is constant (for example, x=0.15), to a thickness (for example 300 nm) which is thinner than the film thickness at which dislocation generation and lattice relaxation actually begin to be prominent, on a p-type or n-type Si substrate 1 fabricated by pulling using the CZ method or similar, as shown in FIG. 11 and FIG. 12.

At this time, the first SiGe layer 2 is deposited to a thickness less than the film thickness at which dislocation generation and lattice relaxation actually begin to be prominent, so that strain energy increases during deposition of the first SiGe layer 2 according to the film thickness, but there are almost no dislocations or lattice relaxation.

The thickness of the first SiGe layer 2 is less than twice the critical thickness $t_c$ satisfying the following equation:

$$t_c(\text{nm}) = (1.9 \times 10^{-3}/\epsilon(x)^2) \cdot \ln(t_c/0.4)$$

$$\epsilon(x) = (a_0 + 0.200326x + 0.026174x^2)/a_0$$

$a_0 = 0.543$ nm ($a_0$ is the Si lattice constant)

Next, the second SiGe layer 3 is grown epitaxially on the first SiGe layer 2.

In this second SiGe layer 3, the Ge composition ratio y is set lower than the maximum value of the Ge composition ratio x in the first SiGe layer 2 at the contact face with the first SiGe layer 2. Further, the second SiGe layer 3 is a $Si_{1-x}Ge_y$ step-like gradient layer, the Ge composition ratio x of which changes in step-like fashion from 0 to y (for example, y=0.3) with a gradient in the film deposition direction.

Next, an $Si_{1-y}Ge_y$ relaxation layer 4, with constant Ge composition ratio, is epitaxially grown on the second SiGe layer 3. By then epitaxially growing Si on the $Si_{1-z}Ge_z$ relaxation layer 4 with Ge composition ratio z (in this embodiment, z=y) to form a strained Si layer 5, manufacture of a semiconductor wafer W comprising a strained Si layer of the invention is completed. The thicknesses of the layers are, for example, 1.5 μm for the second SiGe layer 3, 0.7 to 0.8 μm for the relaxation layer 4, and 1.5 to 22 nm for the strained Si layer 5.

Figure 13:
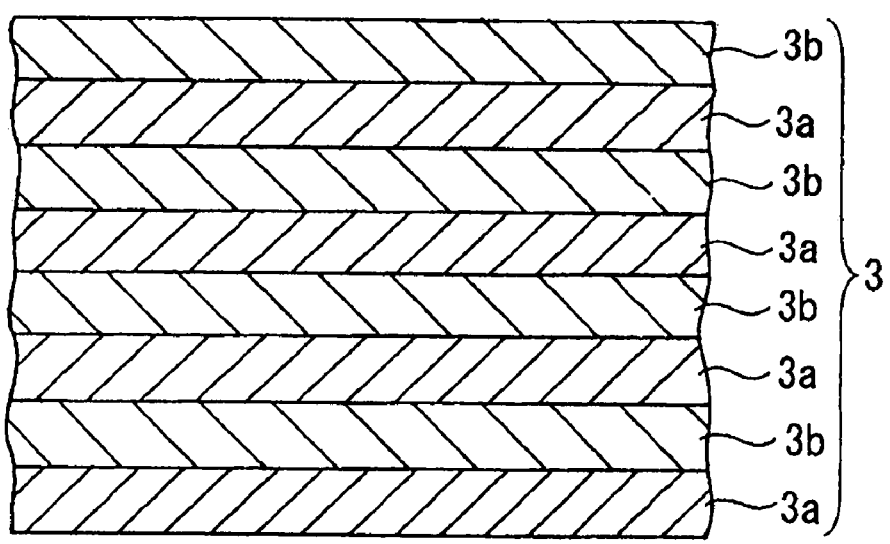
FIG. 13 is a cross-sectional view showing the second SiGe layer in the seventh embodiment of the invention.
Figure 14:
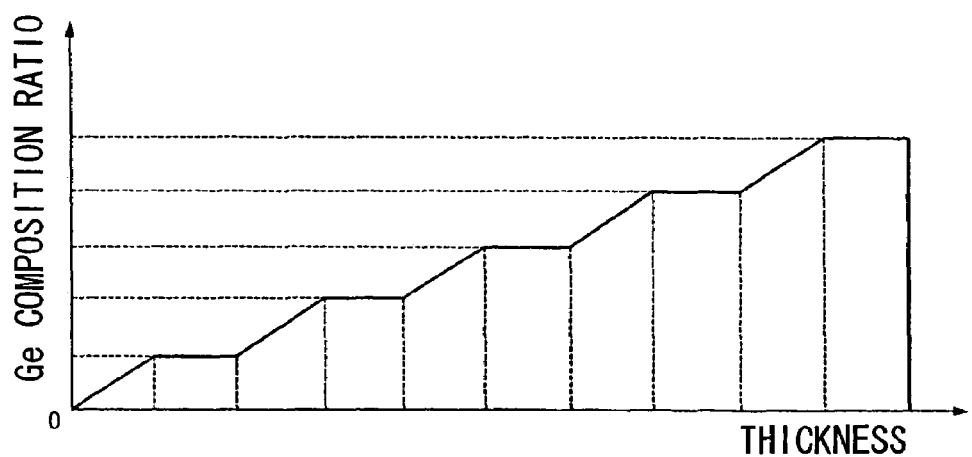
FIG. 14 is a graph showing the Ge composition ratio plotted against the film thickness of the second SiGe layer in the seventh embodiment of the invention.

As shown in FIG. 12 through FIG. 14, deposition of the second SiGe layer 3 is performed by repeating, a plurality of times and with a continuous Ge composition ratio, a process of epitaxially growing an SiGe gradient composition layer 3a the Ge composition ratio in which is increased gradually toward the surface up to a prescribed value, and a process of epitaxially growing an SiGe constant-composition layer 3b on the gradient composition layer 3a, with Ge composition ratio equal to the final Ge composition ratio of the gradient composition layer 3a. The Ge composition ratio at the bottom face of the second SiGe layer 3 is set below the Ge composition ratio at the top face of the first SiGe layer 2. In this embodiment, the Ge composition ratio of the second SiGe layer 3 is increased gradually from zero.

For example, in this embodiment a second SiGe layer 3 may be formed by five repetitions of epitaxial growth processes to form a gradient composition layer 3a and a constant-composition layer 3b. That is, if a single epitaxial growth process to form a gradient composition layer 3a and a constant-composition layer 3b is one step, then as the initial step, a first gradient composition layer 3a is formed on the Si substrate 1, with the Ge composition ratio increased gradually from 0 to 0.06, and on top of this a first constant-composition layer 3b is formed, with Ge composition ratio of 0.06. Then, as the second step, a second gradient composition layer 3a is grown on the first constant-composition layer 3b with Ge composition ratio 0.06, with the Ge composition ratio increased gradually from 0.06 to 0.12; on top of this is then formed a second constant-composition layer 3b with Ge composition ratio of 0.12.

Then, as the third step, a third gradient composition layer 3a is grown on top of the second constant-composition layer 3b with Ge composition ratio of 0.12, with the Ge composition ratio increased gradually from 0.12 to 0.18, and on top of this a third constant-composition layer 3b with Ge composition ratio of 0.18 is formed. Then, as the fourth step, a fourth gradient composition layer 3a is grown on top of the third constant-composition layer 3b with Ge composition ratio of 0.18, with the Ge composition ratio increased gradually from 0.18 to 0.24, and on top of this a fourth constant-composition layer 3b with Ge composition ratio of 0.24 is formed. And as the final step, a fifth gradient composition layer 3a is grown on top of the fourth constant-composition layer 3b with Ge composition ratio of 0.24, with the Ge composition ratio increased gradually from 0.24 to 0.3, and on top of this a fifth constant-composition layer 3b is formed with Ge composition ratio of 0.3. In this embodiment, the thicknesses of each of the gradient composition layers 3a and of each of the constant-composition layers 3b are set to be equal.

When epitaxial growth of the second SiGe layer 3 is begun, strain energy is already accumulated in the first SiGe layer 2, and so at the stage in which the second SiGe layer 3 is thin, dislocation generation and growth begins from the interfaces on both sides of the first SiGe layer 2 and from the side of the first SiGe layer 2 in the second SiGe layer 3, and lattice relaxation begins in the first SiGe layer 2 and in the second SiGe layer 3. At this time, the Ge composition ratio in the second SiGe layer 3 is lower than the maximum value of the Ge composition ratio in the first SiGe layer 2 at the contact face with the first SiGe layer 2, so that dislocations are generated concentrated along interfaces 2a, 2b on both sides of the first SiGe layer 2, dislocation generation at the interfaces 2a, 2b on both sides of the first SiGe layer 2 assists lattice relaxation in the second SiGe layer 3, and dislocation generation and growth in the second SiGe layer 3 are suppressed, while in addition worsening of the surface roughness of the second SiGe layer 3 is also suppressed.

Either during or after formation of the first SiGe layer 2 and second SiGe layer 3, heat treatment is performed equivalent to the heat treatment shown in FIG. 3A in the above-described first embodiment, to cause worsening in advance of the surface roughness of the SiGe layers, and the surface of the second SiGe layer 3, on which irregularities have occurred due to worsening of the surface roughness as a result of heat treatment, is subjected to polishing by CMP or similar as indicated in FIG. 3B for the first embodiment, to flatten the surface and remove irregularities due to worsening of the surface roughness.

Further, through epitaxial growth of an SiGe relaxation layer 4 to a prescribed thickness (for example, 0.75 µm) with the Ge composition ratio z constant and the same as the final Ge composition ratio as in the second SiGe layer 3 (for example, z=0.3), and then through epitaxial growth of single-crystal Si on the SiGe relaxation layer 4, to form a strained Si layer 5 of prescribed thickness (for example, 20 nm), manufacture of a semiconductor wafer W of this embodiment is complete.

In film deposition using the reduced-pressure CVD method, for example, $H_2$ is used as the carrier gas, and $SiH_4$ and $GeH_4$ are used as the source gases.

In the semiconductor wafer W of this embodiment, similarly to the above-described first embodiment, heat treatment is performed during or after formation by epitaxial growth of the second SiGe layer 3, at a temperature exceeding the epitaxial growth temperature, and irregularities in the surface caused by the heat treatment are removed by polishing after formation of the second SiGe layer 3, so that a thermal history is imparted to the substrate in advance, and worsening of the surface roughness due to lattice relaxation and dislocation movement is induced in advance; consequently when performing heat treatment in device manufacturing processes or similar, reoccurrence of worsening of the roughness at surfaces and interfaces can be prevented. And, because the film thickness of the first SiGe layer 2 is set thinner than the film thickness at which dislocation generation and lattice relaxation actually begin to be prominent, the Ge composition ratio y of the second SiGe layer 3 is made lower at least than the maximum value of the Ge composition ratio x in the first SiGe layer 2 at the contact face with the first SiGe layer 2, so that dislocations can be efficiently concentrated at the interface 2a between the Si substrate 1 and the SiGe layer 2 and at the interface 2b between the first SiGe layer 2 and the second SiGe layer 3, and the penetrating dislocation density and surface roughness can be reduced.

Because the Ge composition ratio in the first SiGe layer 2 is constant, the film thickness at which dislocation generation and lattice relaxation actually begin to be prominent for the same Ge composition ratio is the thinnest possible, and there are the advantages that the advantageous results of the invention are obtained at the thinnest film thickness, and that the time required for film deposition is short.

Further, by making the thickness of the first SiGe layer 2 less than twice the critical film thickness $t_c$ satisfying the above equation, the film thickness of the first SiGe layer 2 can easily be set to within the film thickness at which dislocation generation and lattice relaxation actually begin to be prominent, based on the results of experiments described below.

In this embodiment, strain energy is already accumulated in the first SiGe layer 2 before deposition of the second SiGe layer 3, so that in the stage in which the second SiGe layer thickness is thin the generation of dislocations begins within the second SiGe layer, and the above advantageous results are obtained throughout the gradient composition region within the second SiGe layer, the penetrating dislocation density in the surface region of the second SiGe layer is reduced, and worsening of surface roughness is suppressed.

Further, the first SiGe layer functions as a layer to remove impurities at the Si substrate surface such as water, oxygen, and carbon components, with the advantageous result that defects arising from surface contamination of the Si substrate are suppressed.

In this embodiment, deposition of the second SiGe layer 3 is performed by repeating, a plurality of times and with a continuous Ge composition ratio, a process of epitaxially growing an SiGe gradient composition layer 3a the Ge composition ratio in which is increased gradually toward the surface, and a process of epitaxially growing an SiGe constant-composition layer 3b on the gradient composition layer 3a, with Ge composition ratio equal to the final Ge composition ratio of the gradient composition layer 3a. Hence a gradient composition layer 3a and a constant-composition layer 3b are formed in alternation in a plurality of steps to obtain a layer in which the Ge composition changes in gradient steps, and so an SiGe layer can be formed in which, as explained above, the dislocation density is low and there is minimal surface roughness.

That is, in this embodiment the dislocations necessary for lattice relaxation are generated uniformly, and an SiGe layer can be deposited with dislocations running in horizontal directions insofar as possible, without penetrating the surface, so that a satisfactory surface state can be obtained.

In this embodiment also, a field effect transistor (MOSFET) can be manufactured, similarly to FIG. 4 in the above-described first embodiment, using the above semiconductor wafer W.

Figure 15:
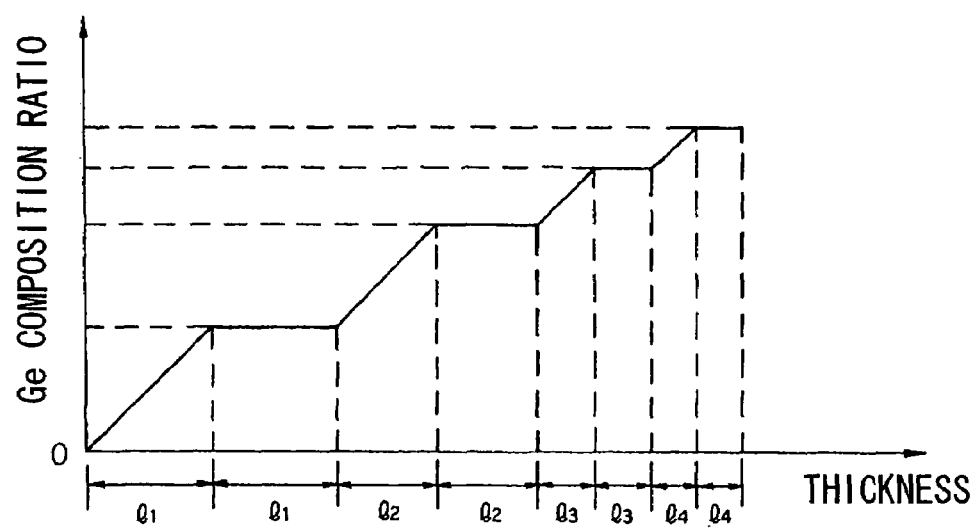
FIG. 15 is a graph showing the Ge composition ratio plotted against the film thickness of the second SiGe layer in the eighth embodiment of the invention.
Figure 16:
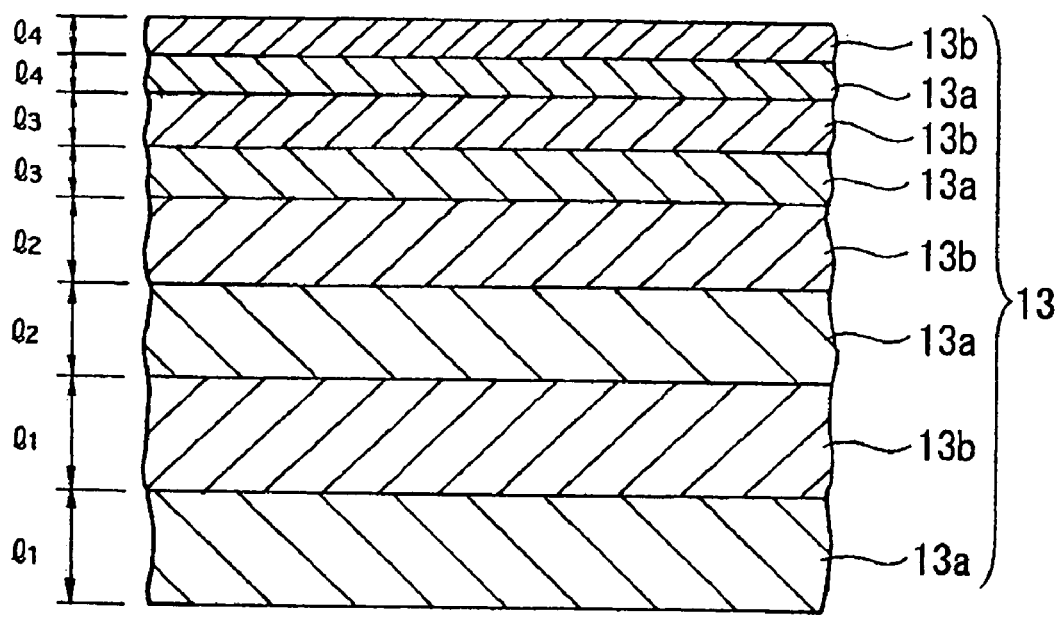
FIG. 16 is a cross-sectional view showing the second SiGe layer in the eighth embodiment of the invention.

Next, an eighth embodiment of the invention is explained based on FIG. 15 and FIG. 16.

A difference between this embodiment and the seventh embodiment is that in the second SiGe layer 3 of the seventh embodiment, the film thicknesses of the gradient composition layers 3a and constant-composition layers 3b are respectively set to be equal, whereas in the eighth embodiment, as shown in FIG. 15 and FIG. 16, in the processes of epitaxial growth of the gradient composition layers 13a and constant-composition layers 13b, the thicknesses of the gradient composition layer 13a and constant-composition layer 13b are gradually reduced with each repetition, to form the second SiGe layer 13. There is also the difference that in the seventh embodiment, the processes of epitaxial growth of gradient composition layers 3a and constant-composition layers 3b are repeated five times, whereas in this embodiment, the processes of epitaxial growth of gradient composition layers 13a and constant-composition layers 13b are repeated four times, to form the second SiGe layer 13.

That is, in the processes of epitaxial growth of gradient composition layers 13a and constant-composition layers 13b of this embodiment, after growing the first gradient composition layer 13a and first constant-composition layer 13b, a second gradient composition layer 13a and second constant-composition layer 13b are grown to be thinner than the first gradient composition layer 13a and first constant-composition layer 13b. Similarly, a third gradient composition layer 13a and third constant-composition layer 13b are grown to be thinner than the second gradient composition layer 13a and second constant-composition layer 13b, and finally a fourth gradient composition layer 13a and fourth constant-composition layer 13b are grown to be thinner than the third gradient composition layer 13a and third constant-composition layer 13b.

Here, either during or after formation of the fourth constant-composition layer 13b, heat treatment similar to that of the above-described embodiments is performed, causing worsening of the SiGe layer surface roughness in advance, and irregularities due to surface roughness worsening caused by heat treatment are removed by polishing the surface of the fourth constant-composition layer 13b by CMP or similar, to flatten the surface and remove irregularities caused by worsening of the surface roughness.

That is, where a thickness of the first gradient composition layer 13a and first constant-composition layer 13b are $1_1$, the second gradient composition layer 13a and second constant-composition layer 13b are $1_2$, the third gradient composition layer 13a and third constant-composition layer 13b are $1_3$, and the fourth gradient composition layer 13a and fourth constant-composition layer 13b are $1_4$, layers are deposited such that $1_1 > 1_2 > 1_3 > 1_4$. Here, $1_4$ represents the thickness of the fourth gradient composition layer 13a and the fourth constant-composition layer 13b after polishing. The critical film thickness at which dislocations occur differs depending on the Ge composition ratio, but each of the above layers is set to a thickness below the critical film thickness, and dislocations necessary for lattice relaxation can occur uniformly in each layer.

The gradients of the Ge composition ratio in each of the gradient composition layers 13a are set so as to be equal.

As explained above, dislocations are generated more readily at higher Ge composition ratios, so that when film deposition is repeated at the same thickness as in the seventh embodiment, more dislocations occur at higher layers; whereas by gradually reducing the thicknesses of the gradient composition layers 13a and constant-composition layers 13b with each repetition as in this embodiment, dislocations can be caused to be generated uniformly in each layer.

Next, a ninth embodiment of the invention is explained based on FIG. 17.

A difference between this embodiment and the seventh embodiment is that, whereas in the first SiGe layer 2 of the seventh embodiment the Ge composition ratio is set to be constant, in this embodiment the Ge composition ratio x of the first SiGe layer is not constant, as shown in FIG. 17. For example, in a first example of this embodiment, the Ge composition ratio x is decreased gradually, with the value of the Ge composition ratio x in the first SiGe layer 12 maximum at the contact face with the Si substrate 1, as shown in FIG. 17A.

That is, in the first example of the embodiment the Ge composition ratio x at the start of film deposition in the process to form the first SiGe layer 12 is 0.3, and thereafter the ratio is gradually decreased until the final Ge composition ratio x is substantially zero, and the film is grown to a prescribed thickness (for example, 350 nm), thinner than the film thickness at which dislocation generation and lattice relaxation actually begin to be prominent, to obtain a gradient composition layer.

In this embodiment, by causing the Ge composition ratio x in the first SiGe layer 12 to be maximum in the layer at the face of contact with the Si substrate 1, strain energy during film deposition is concentrated on the side of the interface with the Si substrate 1, so that upon lattice relaxation at the beginning of deposition of the second SiGe layer 3, dislocations can be caused to occur in greater numbers at the interface with the Si substrate 1 than at the interface with the second SiGe layer 3. As a result, dislocations can be caused to be concentrated at a distance from the side of the surface of the second SiGe layer 3, and similarly to the seventh embodiment, penetrating dislocations and surface roughness can be reduced.

Figure 17A:
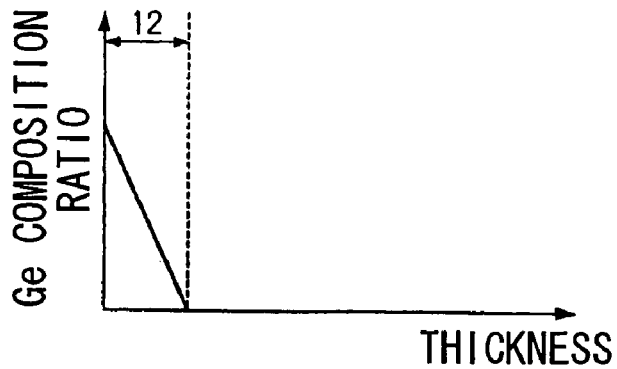
FIGS. 17A to 17D are graphs showing the Ge composition ratio plotted against the film thickness of the first SiGe layer in each of the examples of a ninth embodiment of the invention.
Figure 17B:
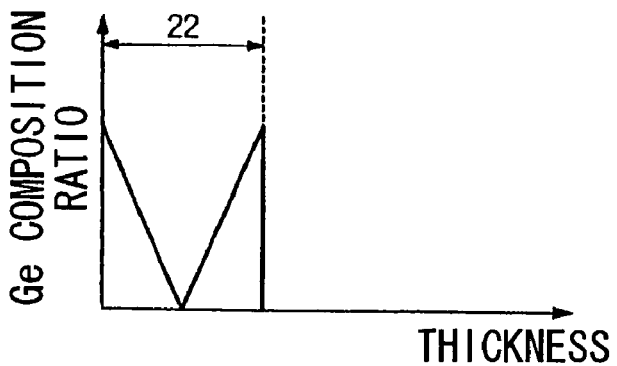

In a second example of this embodiment, as shown in FIG. 17B, the Ge composition ratio x is 0.3 at the start of deposition in the process to form the first SiGe layer 22, and thereafter is decreased gradually until the Ge composition ratio x is substantially zero while depositing the film to a prescribed thickness (for example 350 nm), after which the Ge composition ratio x is gradually increased to a final value of 0.3 while depositing a prescribed thickness (for example 350 nm) to obtain a composition-modified layer.

The thickness of the first SiGe layer 22 is also set to be thinner than the film thickness at which dislocation generation and lattice relaxation actually begin to be prominent.

Figure 17C:
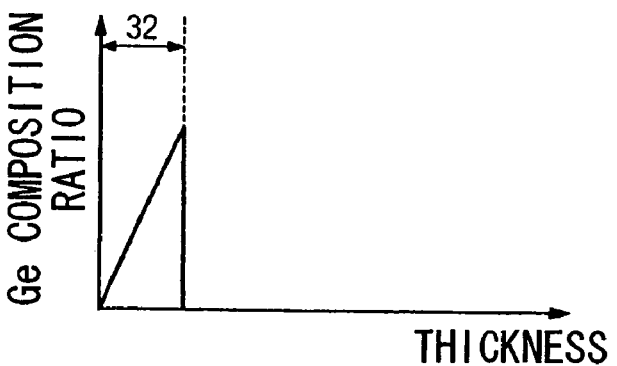

In this second example also, the Ge composition ratio x of the first SiGe layer 22 is maximum in the layer at the contact face with the second SiGe layer 3, so that similarly to the first embodiment, numerous dislocations can be caused to be generated at the interfaces with the Si substrate 1 and with the second SiGe layer 3. And in a third example of this embodiment, as shown in FIG. 17C, the Ge composition ratio x of the first SiGe layer 32 is increased gradually from substantially zero to a final value of 0.3, while depositing film to a prescribed thickness (for example 350 nm) less than the film thickness at which dislocation generation and lattice relaxation actually begin to be prominent.

Figure 17D:
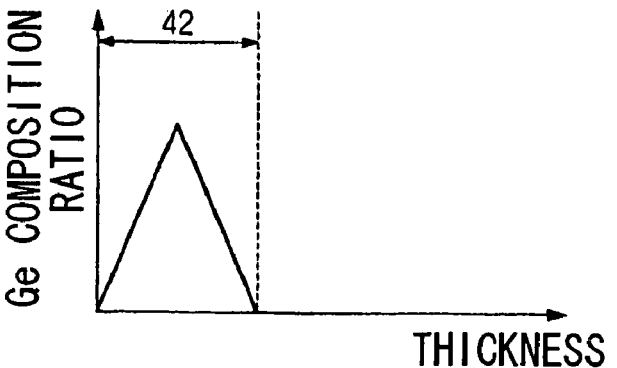

In a fourth example of this embodiment, as shown in FIG. 17D, the Ge composition ratio x of the first SiGe layer 42 is increased gradually from substantially zero to 0.3 while depositing film to a prescribed thickness (for example 350 nm), and the Ge composition ratio x is then decreased gradually from 0.3 to substantially zero while depositing a further prescribed thickness (for example 350 nm). The thickness of the first SiGe layer 42 is set to thinner than the film thickness at which dislocation generation and lattice relaxation actually begin to be prominent.

In these third and fourth examples, the first SiGe layers 32, 42 are set to film thicknesses thinner than the film thickness at which dislocation generation and lattice relaxation actually begin to be prominent, so that during deposition of the second SiGe layer 3 dislocations are generated concentrated at the interfaces on both sides of the first SiGe layers 32, 42, and penetrating dislocations and surface roughness can be reduced. In the third and fourth examples, the maximum value of the Ge composition ratio in the first SiGe layers 32 and 42 is not on the side of the interface with the Si substrate 1, so that a greater effect in alleviating penetrating dislocations and surface roughness is obtained in the first and second embodiments.

The technical scope of the invention is not limited to the above embodiments, and various modifications can be made without deviating from the gist of the invention.

For example, in each of the above embodiments, five distributions are assumed for the distribution of the Ge composition ratio in the film thickness direction in the first SiGe layer; but other distributions may be employed. For example, as the first SiGe layer a multilayer film may be used comprising a plurality of SiGe layers with different Ge composition ratios. Further, the multilayer film may be a multiplayer film comprising Si layers.

Further, in each of the above embodiments, when the Ge composition ratio is varied within the first SiGe layer, the composition is varied at a constant rate in the film thickness direction; but a structure may be employed in which the rate is not constant.

The first SiGe layer is a layer comprising Ge, and need only be able to accumulate strain energy; any other Ge composition ratio distribution may be employed.

In each of the above embodiments, gradient composition layers within the second SiGe layers, in which the Ge composition ratio is increased gradually toward the surface, are layers in which the composition is changed at a constant rate in the film thickness direction; but a structure may be employed in which the rate is not constant.

In each of the above embodiments, the second SiGe layer is positioned directly on top of the first SiGe layer; but the second SiGe layer may be positioned with an Si layer intervening.

In each of the above embodiments, a structure may be employed in which a further SiGe layer is deposited on top of the strained Si layer of the semiconductor wafer.

In each of the above embodiments, a semiconductor wafer having an SiGe layer is fabricated as a substrate for MOSFETs; but the wafer may be used as a substrate in other applications. For example, the semiconductor substrates and semiconductor substrate manufacturing methods of the invention may be used as substrates for solar cells or for optical devices. That is, in each of the above-described embodiments, a second SiGe layer and a third SiGe layer may be deposited such that the uppermost surface comprises from 65% to 100% Ge, or comprises 100% Ge, and by depositing InGaP (indium-gallium phosphide), GaAs (gallium arsenide), or AlGaAs (aluminum-gallium arsenide) on top thereof, a substrate for solar cells or for optical devices may be manufactured. In this case, a substrate for solar cells with excellent characteristics and a low dislocation density is obtained.

EXAMPLES

Figure 18:
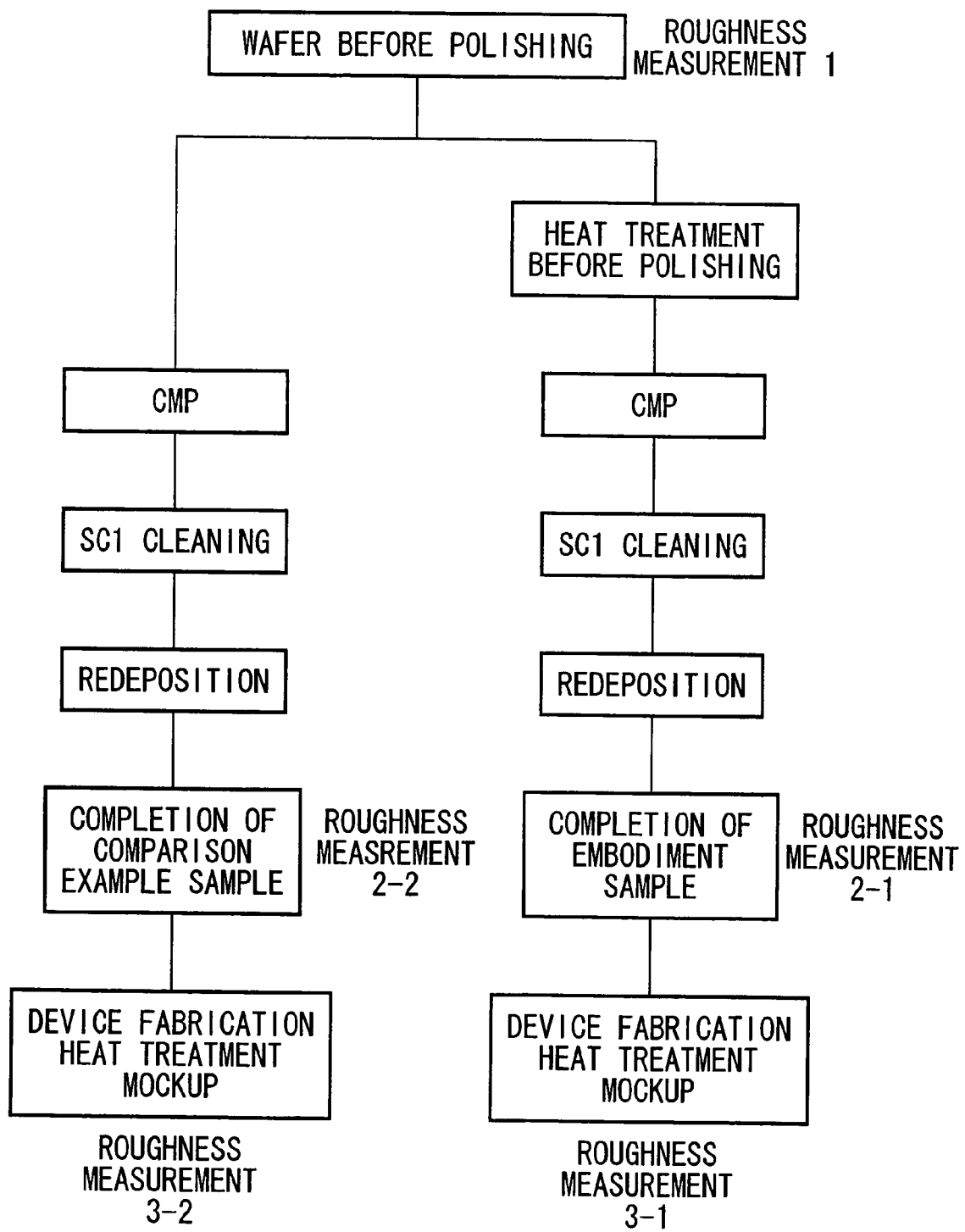
FIG. 18 is a flowchart of manufacturing in an example of the invention and in a comparative example; and, FIG. 19 explains the wafer layer structure before polishing and the Ge composition ratio in an example of the invention and in a comparative example.
Figure 19:
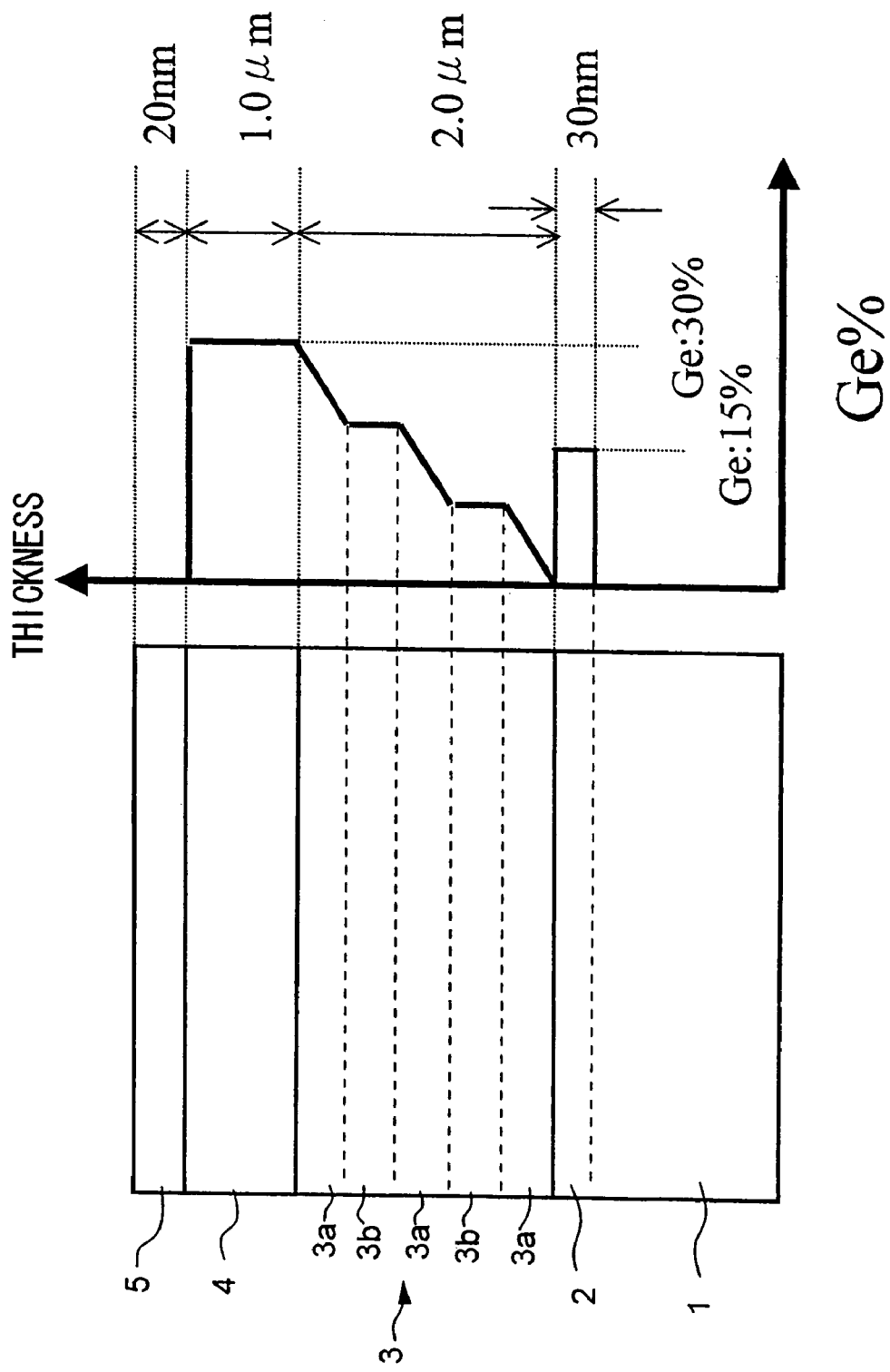

Next, worsening of the roughness at the surface and interfaces when heat treatment is performed prior to polishing based on the above embodiments is explained in detail, referring to FIG. 18 and FIG. 19.

As an example based on the above seventh embodiment and a comparative example, films were deposited, in both cases using a Si substrate of diameter 200 mm, with a single-wafer reduced-pressure epitaxial growth system employed to deposit films with $SiH_4$ and $GeH_4$ intermixed with the carrier hydrogen gas, at pressures between 5000 and 15,000 Pa and temperatures of 680 to 850° C. FIG. 18 is a flow chart of fabrication of the example and comparative example.

In this case, prior to annealing treatment and polishing, the first SiGe layer 2, second SiGe layer 3, relaxation layer 4, and strained Si layer 5 were deposited to respective thicknesses of 30 nm, 2.0 μm, 1.0 μm, and 20 nm, as indicated in FIG. 19. The Ge composition ratio of the first SiGe layer 2 was 0.15, and in the second SiGe layer 3, three gradient composition layers 3a were formed, with the final Ge composition ratio 0.30 in the gradient composition layer 3a at the uppermost surface.

Annealing treatment prior to polishing was performed using a single-wafer reduced-pressure epitaxial growth system in a nitrogen gas flow at 1100° C. for 30 minutes.

The polishing (CMP treatment) after annealing was performed using an 0.5 μm abrasive; ordinary SC1 cleaning was performed after the polishing.

After the SC1 cleaning, the second SiGe layer 3 was deposited under the same deposition conditions as before, to a thickness of 0.5 μm, after which the strained Si layer 4 was deposited to a thickness of 20 nm.

Finally, mockups of heat treatment in a device manufacturing process were conducted, and in order to compare the heat resistance of the samples of this example and the comparative example, a horizontal-type heating furnace was used to conduct further heat treatment in a nitrogen gas flow at 1100° C. for 30 minutes.

A surface roughness gauge was used to perform measurements of the samples manufactured in the above-described example and comparative example. For comparison, measurements were performed before polishing and before and after the mockup of the heat treatment for device manufacture.

In measurements using the surface roughness gauge, a cutoff length of 0.1 mm and measurement step of 0.2 μm were employed.

The results of these measurements were as follows.

Roughness measurement 1: This example and comparative example—wafers before polishing RMS: 1.75 nm Roughness measurement 2-1: This example—wafer after polishing and immediately after re-deposition RMS: 0.24 nm Roughness measurement 2-2: Comparative example—wafer after polishing and immediately after re-deposition RMS: 0.75 nm Roughness measurement 3-1: This example—wafer after heat treatment mockup RMS: 0.30 nm Roughness measurement 3-2: Comparative example—wafer after heat treatment mockup RMS: 0.85 nm From the above results, it is seen that compared with the comparative example, the change in RMS after the heat treatment mockup was extremely small for this example, and a satisfactory surface state was obtained.

INDUSTRIAL APPLICABILITY

By means of the invention, the following advantageous results are obtained.

(1) By means of a semiconductor substrate and semiconductor substrate manufacturing method of the invention, the film thickness of the first SiGe layer is set to be thinner than twice the critical film thickness which is the film thickness at which lattice relaxation occurs with increasing film thickness due to occurrence of dislocations; the Ge composition ratio in the second SiGe layer is made lower than the maximum value in the first SiGe layer or in the first SiGe layer at the contact face with the Si substrate, and moreover the second SiGe layer has at least a portion which is a gradient composition region in which the Ge composition ratio increases gradually toward the surface, so that dislocations can be concentrated efficiently near the interface of the Si substrate and the first SiGe layer and near the interface of the first SiGe layer and the second SiGe layer, and the penetrating dislocation density and surface roughness at the surface of the second SiGe layer can be reduced.

(2) By means of a semiconductor substrate and semiconductor substrate manufacturing method of the invention, heat treatment is performed either during or after formation of an SiGe layer by epitaxial growth at a temperature exceeding the epitaxial growth temperature, and polishing after SiGe layer formation is used to remove irregularities in the surface arising from the heat treatment, so that even when this substrate, with irregularities in the surface due to the advance thermal history removed by polishing, is subjected to heat treatment in a device manufacturing process or similar, reoccurrence of worsening of the roughness at the surface and interfaces can be prevented.

(3) By means of a semiconductor substrate and semiconductor substrate manufacturing method of the invention, the film thickness of the first SiGe layer is set to less than twice the critical film thickness which is the film thickness at which dislocations are generated with increasing film thickness and lattice relaxation occurs; the second SiGe layer is formed by stacking repeatedly and in alternation, and such that the Ge composition ratio is continuous, a SiGe gradient composition layer, the Ge composition ratio in which increases gradually toward the surface, and a SiGe constant-composition layer positioned on top of the gradient composition layer, with Ge composition ratio equal to that at the top surface of the gradient composition layer, with the Ge composition ratio at the bottom face of the second SiGe layer lower than the maximum value of the Ge composition ratio in the first SiGe layer, so that dislocations can be caused to be concentrated efficiently near the interface between the Si substrate and the first SiGe layer and near the interface between the first SiGe layer and the second SiGe layer, and moreover dislocations can be made to run in horizontal directions so as not to penetrate the surface. Hence through these mutually reinforcing advantageous results, a substrate with good-quality crystallinity, with a low penetrating dislocation density and minimal surface roughness, can be obtained.

(4) Further, by means of a field effect transistor and field effect transistor manufacturing method of the invention, the channel region is formed in the strained Si layer of a semiconductor substrate of the invention or of a semiconductor substrate manufactured by a semiconductor substrate manufacturing method of the invention, so that due to the good-quality strained Si layer, MOSFETs with excellent characteristics can be obtained with high production yields.

The invention claimed is:

1. A method of manufacturing a semiconductor substrate in which an SiGe layer is grown epitaxially on Si substrate, comprising:
    a first layer formation process of epitaxially growing a first SiGe layer on said Si substrate;
    a second layer formation process of epitaxially growing a second SiGe layer either directly onto said first SiGe layer, or with an epitaxially grown Si layer intervening;
    a heat treatment process of performing heat treatment, either during or after formation by epitaxial growth of said SiGe layers, at a temperature exceeding the epitaxial growth temperature; and
    a polishing process of removing by polishing the irregularities in the surface caused by said heat treatment, wherein
    in said first layer formation process, the film thickness of said first SiGe layer is set to be thinner than twice the critical film thickness, which is the film thickness at which dislocations arise and lattice relaxation occurs due to increasing film thickness;
    in said second layer formation process, the Ge composition ratio in the second SiGe layer is, at least at the contact face with the first SiGe layer or with the Si layer, set lower than the maximum value of the Ge composition ratio in the first SiGe layer, and moreover a gradient composition region is formed in at least a portion of which the Ge composition ratio rises gradually in moving toward the surface; and
    said polishing process is performed after formation of said second SiGe layer.

2. The method of manufacturing a semiconductor substrate according to claim 1, wherein, in said first layer formation process, the Ge composition ratio x of said first SiGe layer is constant, and the thickness of said first SiGe layer is set to less than twice the critical film thickness $t_c$ satisfying the following equation:

$$t_c(\text{nm}) = (1.9 \times 10^{-3}/\epsilon(x)^2) \cdot \ln(t_c/0.4)$$

$$\epsilon(x) = (0.0200326x + 0.0026174x^2)/a_0$$

$$a_0 = 0.543 \text{ nm},$$

where $a_0$ is the Si lattice constant.

3. The method of manufacturing a semiconductor substrate according to claim 1 or 2, wherein the Ge composition ratio of said first SiGe layer is 0.05 or greater and 0.3 or less.

4. The method of manufacturing a semiconductor substrate according to claim 3, wherein said second SiGe layer is positioned directly on top of said first SiGe layer, and said second SiGe layer is a gradient composition layer the Ge composition ratio in the entire layer of which increases gradually toward the surface.

5. A method of manufacturing a semiconductor substrate, in which a strained Si layer is formed on Si substrate with an SiGe layer intervening, wherein said strained Si layer is grown epitaxially either directly onto said second SiGe layer of a semiconductor substrate manufactured by the semiconductor substrate manufacturing method of claim 4, or with another SiGe layer intervening.

6. A method of manufacturing a field effect transistor, the channel region of which is formed in a strained Si layer grown epitaxially on an SiGe layer, wherein said channel region is formed in said strained Si layer of a semiconductor substrate manufactured by the semiconductor substrate manufacturing method according to claim 5.

7. A field effect transistor, the channel region of which is formed in a strained Si layer grown epitaxially on an SiGe layer, characterized in being manufactured by the field effect transistor manufacturing method according to claim 6.

8. A method of manufacturing a semiconductor substrate, in which a strained Si layer is formed on Si substrate with an SiGe layer intervening, wherein said strained Si layer is grown epitaxially either directly onto said second SiGe layer of a semiconductor substrate manufactured by the semiconductor substrate manufacturing method of claim 3, or with another SiGe layer intervening.

9. A method of manufacturing a field effect transistor, the channel region of which is formed in a strained Si layer grown epitaxially on an SiGe layer, wherein said channel region is formed in said strained Si layer of a semiconductor substrate manufactured by the semiconductor substrate manufacturing method according to claim 8.

10. A field effect transistor, the channel region of which is formed in a strained Si layer grown epitaxially on an SiGe layer, characterized in being manufactured by the field effect transistor manufacturing method according to claim 9.

11. The method of manufacturing a semiconductor substrate according to claim 1 or 2, wherein said second SiGe layer is positioned directly on top of said first SiGe layer, and said second SiGe layer is a gradient composition layer the Ge composition ratio in the entire layer of which increases gradually toward the surface.

12. A method of manufacturing a semiconductor substrate, in which a strained Si layer is formed on Si substrate with an SiGe layer intervening, wherein said strained Si layer is grown epitaxially either directly onto said second SiGe layer of a semiconductor substrate manufactured by the semiconductor substrate manufacturing method of claim 11, or with another SiGe layer intervening.

13. A method of manufacturing a field effect transistor, the channel region of which is formed in a strained Si layer grown epitaxially on an SiGe layer, wherein said channel region is formed in said strained Si layer of a semiconductor substrate manufactured by the semiconductor substrate manufacturing method according to claim 12.

14. A field effect transistor, the channel region of which is formed in a strained Si layer grown epitaxially on an SiGe layer, characterized in being manufactured by the field effect transistor manufacturing method according to claim 13.

15. A method of manufacturing a semiconductor substrate, in which a strained Si layer is formed on Si substrate with an SiGe layer intervening, wherein said strained Si layer is grown epitaxially either directly onto said second SiGe layer of a semiconductor substrate manufactured by the semiconductor substrate manufacturing method of claim 1 or 2, or with another SiGe layer intervening.

16. A method of manufacturing a field effect transistor, the channel region of which is formed in a strained Si layer grown epitaxially on an SiGe layer, wherein said channel region is formed in said strained Si layer of a semiconductor substrate manufactured by the semiconductor substrate manufacturing method according to claim 15.

17. A field effect transistor, the channel region of which is formed in a strained Si layer grown epitaxially on an SiGe layer, characterized in being manufactured by the field effect transistor manufacturing method according to claim 16.

18. A semiconductor substrate, characterized by comprising:
an Si substrate;
a first SiGe layer on the Si substrate; and
a second SiGe layer positioned either directly on the first SiGe layer or with a Si layer intervening, wherein said first SiGe layer has film thickness less than twice the critical film thickness, which is the film thickness at which dislocations arise and lattice relaxation occurs due to increasing film thickness;

said second SiGe layer has Ge composition ratio, at least at the contact face with said first SiGe layer or with said Si layer, lower than the maximum value of the Ge composition ratio in said first SiGe layer, and has a gradient composition region, at least a portion of which, the Ge composition ratio increases gradually toward the surface; and, aid semiconductor substrate is manufactured by the semiconductor substrate manufacturing method according to claim 1.

19. The semiconductor substrate according to claim 18, wherein the Ge composition ratio x of said first SiGe layer is constant, and the thickness of said first SiGe layer is set to less than twice the critical film thickness $t_c$ satisfying the following equation:

$$t_c(\text{nm}) = (1.9 \times 10^{-3}/\epsilon(x)^2) \cdot \ln(t_c/0.4)$$

$$\epsilon(x) = (0.0200326x + 0.0026174x^2)/a_0$$

$$a_0 = 0.543 \text{ nm},$$

where $a_0$ is the Si lattice constant.

20. The semiconductor substrate according to claim 18 or 19, wherein the Ge composition ratio of said first SiGe layer is 0.05 or greater and 0.3 or less.

21. The semiconductor substrate according to claim 20, wherein said second SiGe layer is positioned directly on said first SiGe layer, and moreover the second SiGe layer is a gradient composition layer the Ge composition ratio of which increases gradually toward the surface throughout the entire layer.

22. A semiconductor substrate, comprising a strained Si layer positioned either directly on said second SiGe layer of the semiconductor substrate of claim 21, or with another SiGe layer intervening.

23. The semiconductor substrate according to claim 18 or 19, wherein said second SiGe layer is positioned directly on said first SiGe layer, and moreover the second SiGe layer is a gradient composition layer the Ge composition ratio of which increases gradually toward the surface throughout the entire layer.

24. A semiconductor substrate, comprising a strained Si layer positioned either directly on said second SiGe layer of the semiconductor substrate of claim 23, or with another SiGe layer intervening.

25. A semiconductor substrate, comprising a strained Si layer positioned either directly on said second SiGe layer of the semiconductor substrate of claim 18 or 19, or with another SiGe layer intervening.

26. A method of manufacturing a semiconductor substrate in which an SiGe layer is grown epitaxially on Si substrate, comprising:

a first layer formation process of epitaxially growing a first SiGe layer on said Si substrate;

a second layer formation process of epitaxially growing a second SiGe layer either directly onto said first SiGe layer, or with an epitaxially grown Si layer intervening;

a heat treatment process of performing heat treatment, either during or after formation by epitaxial growth of said SiGe layers, at a temperature exceeding the epitaxial growth temperature; and a polishing process of removing by polishing the irregularities in the surface caused by said heat treatment, wherein
in said first layer formation process, the film thickness of said first SiGe layer is set to be thinner than twice the critical film thickness, which is the film thickness at which dislocations arise and lattice relaxation occurs due to increasing film thickness;

in said second layer formation process, a process of epitaxially growing an SiGe gradient composition layer with Ge composition ratio increased gradually toward the surface and a process of epitaxially growing an SiGe constant-composition layer on said gradient composition layer at the final Ge composition ratio of the gradient composition layer are repeated in alternation a plurality of times at continuous Ge composition ratios, to deposit the second SiGe layer with Ge composition ratio changing in step-like fashion and having a gradient in the deposition direction;

the Ge composition ratio at the bottom face of the second SiGe layer is made lower than the maximum value of the Ge composition ratio in said first SiGe layer; and said polishing process is performed after formation of said SiGe layer.

27. The method of manufacturing a semiconductor substrate according to claim 26, wherein, in said first layer formation process, the Ge composition ratio x of said first SiGe layer is constant, and the thickness of said first SiGe layer is set to less than twice the critical film thickness $t_c$ satisfying the following equation:

$$t_c(\text{nm}) = (1.9 \times 10^{-3}/\epsilon(x)^2) \cdot \ln(t_c/0.4)$$

$$\epsilon(x) = (0.0200326x + 0.0026174x^2)/a_0$$

$$a_0 = 0.543 \text{ nm},$$

where $a_0$ is the Si lattice constant.

28. The method of manufacturing a semiconductor substrate according to claim 26 or 27, wherein the Ge composition ratio of said first SiGe layer is 0.05 or greater and 0.3 or less.

29. A method of manufacturing a semiconductor substrate, in which a strained Si layer is formed on Si substrate with an SiGe layer intervening, characterized in that said strained Si layer is grown epitaxially either directly onto said second SiGe layer of a semiconductor substrate manufactured by the semiconductor substrate manufacturing method of claim 28, or with another SiGe layer intervening.

30. A method of manufacturing a field effect transistor, the channel region of which is formed in a strained Si layer grown epitaxially on an SiGe layer, wherein said channel region is formed in said strained Si layer of a semiconductor substrate manufactured by the semiconductor substrate manufacturing method according to claim 29.

31. A field effect transistor, the channel region of which is formed in a strained Si layer grown epitaxially on an SiGe layer, characterized in being manufactured by the field effect transistor manufacturing method according to claim 30.

32. A method of manufacturing a semiconductor substrate, in which a strained Si layer is formed on Si substrate with an SiGe layer intervening, characterized in that said strained Si layer is grown epitaxially either directly onto said second SiGe layer of a semiconductor substrate manufactured by the semiconductor substrate manufacturing method of claim 26 or 27, or with another SiGe layer intervening.

33. A method of manufacturing a field effect transistor, the channel region of which is formed in a strained Si layer grown epitaxially on an SiGe layer, wherein said channel region is formed in said strained Si layer of a semiconductor substrate manufactured by the semiconductor substrate manufacturing method according to claim 32.

34. A field effect transistor, the channel region of which is formed in a strained Si layer grown epitaxially on an SiGe layer, characterized in being manufactured by the field effect transistor manufacturing method according to claim 33.

35. A semiconductor substrate, comprising an Si substrate, a first SiGe layer on the Si substrate, and a second SiGe layer positioned either directly on the first SiGe layer or with a Si layer intervening, wherein said first SiGe layer has film thickness less than twice the critical film thickness, which is the film thickness at which dislocations arise and lattice relaxation occurs due to increasing film thickness;

said second SiGe layer is configured by stacking in alternation and with continuous Ge composition rate a plurality of SiGe gradient composition layers the Ge composition ratio of which increases gradually toward the surface and SiGe constant-composition layers, positioned on the gradient composition layers, at the Ge composition ratio of the upper face of the gradient composition layer;

the Ge composition ratio at the bottom face of said second SiGe layer is lower than the maximum value of the Ge composition ratio in said first SiGe layer; and, said semiconductor substrate is manufactured by the semiconductor substrate manufacturing method according to claim 26.

36. The semiconductor substrate according to claim 35, wherein the Ge composition ratio x of said first SiGe layer is constant, and the thickness of said first SiGe layer is set to less than twice the critical film thickness $t_c$ satisfying the following equation:

$$t_c(\text{nm}) = (1.9 \times 10^{-3}/\epsilon(x)^2) \cdot \ln(t_c/0.4)$$

$$\epsilon(x) = (0.0200326x + 0.0026174x^2)/a_0$$

$$a_0 = 0.543 \text{ nm},$$

where $a_0$ is the Si lattice constant.

37. The semiconductor substrate according to claim 35 or 36, characterized in that the Ge composition ratio of said first SiGe layer is 0.05 or greater and 0.3 or less.

38. A semiconductor substrate, comprising a strained Si layer, positioned either directly on said second SiGe layer of the semiconductor substrate according to claim 37, or with another SiGe layer intervening.

39. A semiconductor substrate, comprising a strained Si layer, positioned either directly on said second SiGe layer of the semiconductor substrate according to claim 35 or 36, or with another SiGe layer intervening.

* * * * *